United States Patent
Wong et al.

(10) Patent No.: US 12,382,703 B2
(45) Date of Patent: Aug. 5, 2025

(54) SPACER FEATURES FOR NANOSHEET-BASED DEVICES

(71) Applicant: Taiwan Semiconductor Manufacturing Company, Ltd., Hsin-Chu (TW)

(72) Inventors: I-Hsieh Wong, Hsinchu (TW); Alex Lee, Hsinchu (TW); Wei-Han Fan, Hsin-Chu (TW); Tzu-Hua Chiu, Hsinchu (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 749 days.

(21) Appl. No.: 17/465,259

(22) Filed: Sep. 2, 2021

(65) Prior Publication Data

US 2022/0328648 A1 Oct. 13, 2022

Related U.S. Application Data

(60) Provisional application No. 63/172,824, filed on Apr. 9, 2021.

(51) Int. Cl.
*H10D 64/66* (2025.01)
*H01L 21/02* (2006.01)
(Continued)

(52) U.S. Cl.
CPC ..... *H10D 64/679* (2025.01); *H01L 21/02211* (2013.01); *H01L 21/0259* (2013.01);
(Continued)

(58) Field of Classification Search
CPC ........... H01L 29/4991; H01L 21/02211; H01L 21/0259; H01L 21/28123; H01L 21/764;
(Continued)

(56) References Cited

U.S. PATENT DOCUMENTS 10,559,656 B2 2/2020 Bourjot et al.
10,600,889 B2 3/2020 Cheng
(Continued)

FOREIGN PATENT DOCUMENTS

| CN | 111952371 A | 11/2020 |
| TW | 201830498 A | 8/2018 |
| TW | 202103323 A | 1/2021 |

*Primary Examiner* — Sue A Purvis
*Assistant Examiner* — Carnell Hunter, III
(74) *Attorney, Agent, or Firm* — HAYNES AND BOONE, LLP

(57) ABSTRACT

A semiconductor device includes a base portion on a semiconductor substrate, a channel layer vertically above the base portion and extending parallel to a top surface of the semiconductor substrate, a gate portion between the channel layer and the base portion, a source/drain feature connected to the channel layer, an inner spacer between the source/drain feature and the gate portion, and an air gap between the source/drain feature and the semiconductor substrate. Moreover, a bottom surface of the source/drain feature is exposed in the air gap.

20 Claims, 18 Drawing Sheets

(51) Int. Cl.
  *H01L 21/28*       (2006.01)
  *H01L 21/764*      (2006.01)
  *H10D 30/01*       (2025.01)
  *H10D 30/67*       (2025.01)
  *H10D 62/10*       (2025.01)
  *H10D 64/01*       (2025.01)

(52) U.S. Cl.
  CPC ...... *H01L 21/28123* (2013.01); *H01L 21/764* (2013.01); *H10D 30/031* (2025.01); *H10D 30/6713* (2025.01); *H10D 30/6735* (2025.01); *H10D 30/6739* (2025.01); *H10D 30/6757* (2025.01); *H10D 62/118* (2025.01); *H10D 64/018* (2025.01)

(58) Field of Classification Search
  CPC ........... H01L 29/0665; H01L 29/42392; H01L 29/4908; H01L 29/66553; H01L 29/66742; H01L 29/78618; H01L 29/78696
  See application file for complete search history.

(56) References Cited

U.S. PATENT DOCUMENTS

| | | | |
|---|---|---|---|
| 10,867,997 B2 | 12/2020 | Yoon et al. | |
| 2018/0301564 A1* | 10/2018 | Kwon | H01L 29/0653 |
| 2018/0315828 A1* | 11/2018 | Yamashita | H01L 29/66545 |
| 2020/0075423 A1* | 3/2020 | Kwok | H01L 21/823481 |
| 2020/0343373 A1 | 10/2020 | Tsai et al. | |
| 2020/0365692 A1* | 11/2020 | Jung | H01L 29/785 |
| 2021/0057539 A1 | 2/2021 | Chiang et al. | |

\* cited by examiner

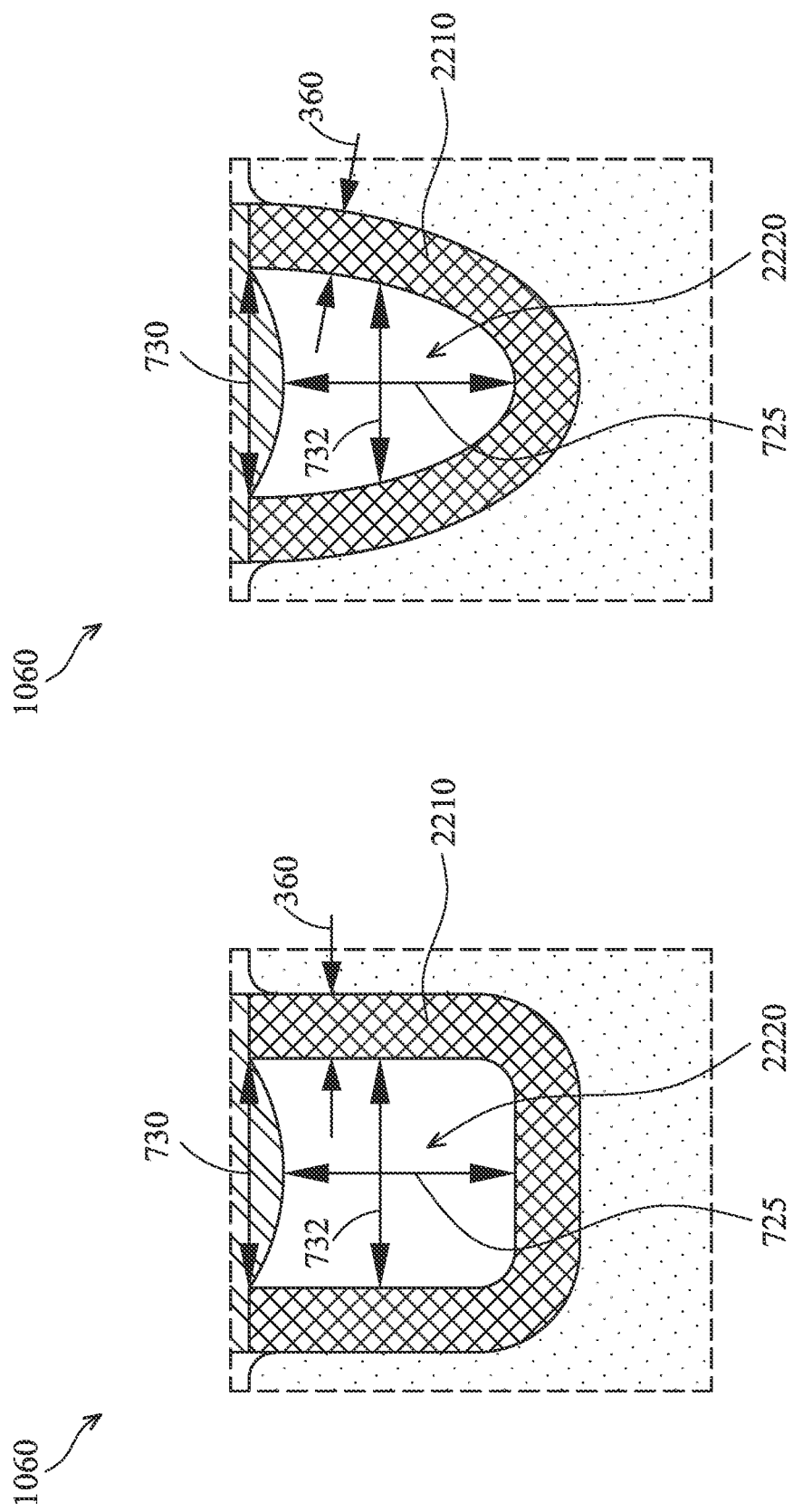

SPACER FEATURES FOR NANOSHEET-BASED DEVICES

PRIORITY DATA

This application claims priority to U.S. Provisional Patent Application No. 63/172,824, filed on Apr. 9, 2021, entitled "Spacer Features for Nanosheet-based Devices", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nanosheet-based transistor, whose gate structure extends around its channel region providing access to the channel region on all sides. The nanosheet-based transistors are compatible with conventional metal-oxide-semiconductor (MOS) processes, allowing them to be aggressively scaled down while maintaining gate control and mitigating SCEs. Conventional nanosheet-based transistors, however, may suffer damages to the source/drain features at the inner spacer seams during the channel release process. Such damages have been shown to degrade device characteristics. Therefore, although conventional nanosheet-based devices have been generally adequate for their intended purposes, they are not satisfactory in every respect. Accordingly, the present disclosure described structures of source/drain features that have reduced amounts of such dislocations, thereby providing methods for improved devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11A, 11B, 11C, 12, 13, 14, 15A, 15B, 15C, and 15D are cross-sectional views of embodiments of nanosheet-based devices of the present disclosure along the line A-A' in FIG. 1A constructed, in portions or in entirety, at various fabrication stages according to some embodiments of the present disclosure.

DETAILED DESCRIPTION

Figures 1A, 1B:
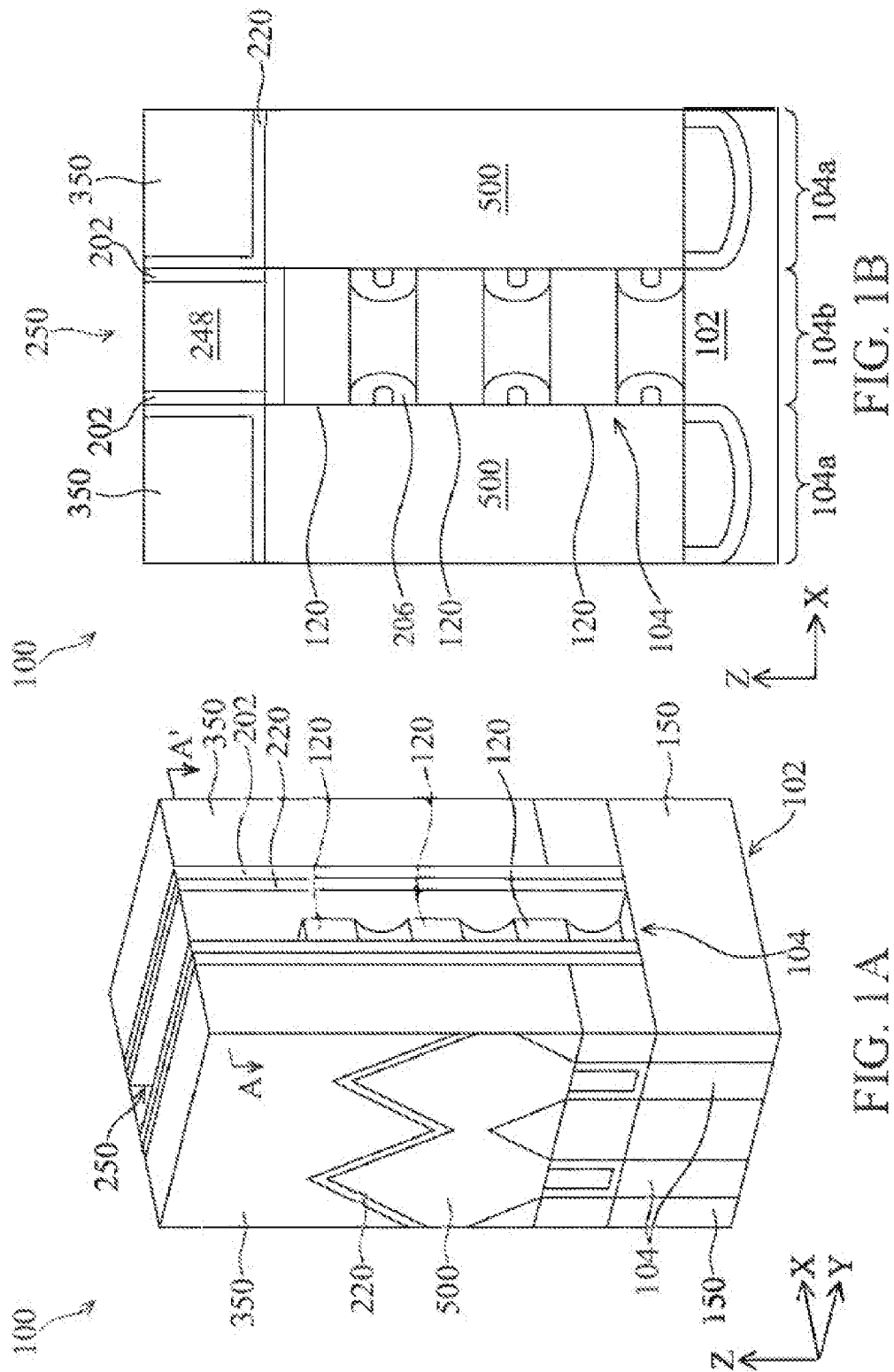
FIG. 1A is a three-dimensional (3D) perspective view of an embodiment of a nanosheet-based device of the present disclosure constructed according to some embodiments of the present disclosure.
FIG. 1B is a cross-sectional view of an embodiment of a nanosheet-based device of the present disclosure along the line A-A' in FIG. 1A constructed according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nanosheet-based transistors (or devices). A nanosheet-based device includes a plurality of suspended channel layers (or simply "channel layers") stacked one on top of another and engaged by a gate structure. The channel layers of a nanosheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nanosheet-based devices broadly encompasses devices having channel layers in nanowire, nano-bars, and any other suitable shapes. Further, the channel layers of the nanosheet-based devices may engage with a single, contiguous gate structure, or multiple gate structures.

The channel layers engage with a gate structure that includes portions between vertically adjacent channel layers. Inner spacers are formed between the source/drain features and the respective gate structure such that proper electrical isolation is maintained. A pair of epitaxial source/drain features (interchangeably referred to as epitaxial features or source/drain features) are formed on both ends of the channel layers, such that the charge carriers may flow from the source region to the drain region through the channel layers during the operation (such as when the transistors are turned on). In some approaches, inner spacers may have a profile resembling a "V" shape (or triangular shape), where the side arms of the "V" align and interface with the channel layers, and the bottom portion of the "V" shares a sidewall with subsequently formed gate structure. The side arms and the bottom portion collectively define an opening. Because source/drain features do not generally grow from dielectric materials, such openings often remain in final device structures. However, it has been observed that the presence of the openings leads to damages to source/drain features during a subsequent channel release process, thereby degrading the device performances. Accordingly, this present disclosure provides a method that removes such openings and replace them with a material feature. Moreover, the present disclosure further provides a source/drain feature structure that further improves device characteristics.

The nanosheet-based devices presented herein may be an n-type metal-oxide-semiconductor (NMOS) device, a p-type metal-oxide-semiconductor (PMOS) device, or a complementary metal-oxide-semiconductor (CMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from some aspects of the present disclosure.

An example nanosheet-based transistor 100 (or nanosheet-based device 100, or device 100) is illustrated in FIGS. 1A and 1B. FIG. 1A is a three-dimensional (3D) perspective view of an embodiment of device 100 that may be implemented as an NMOS device, a PMOS device, or part of a CMOS device, according to embodiments of the present disclosure. FIG. 1B is a cross-sectional view of the device 100 of FIG. 1A along the line A-A'. FIGS. 1A and 1B are provided for better visualization and understanding of features subsequently described in cross-sectional views. FIGS. 1A and 1B have been abbreviated and may not include all features described in detail later. As illustrated, the device 100 includes a semiconductor substrate (or substrate) 102. Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a stack of suspended semiconductor layers 120 (also interchangeably referred to as "semiconductor layers 120," "suspended channel layers 120," "channel layers 120," "channels 120," or "higher channels 120") in the channel region 104b of the fin structures 104 and the stack extends vertically (e.g. along the Z-direction) from the substrate 102. Each of the suspended semiconductor layers 120 connects a pair of epitaxial source/drain features 500. The suspended semiconductor layers 120 may each be in one of many different shapes, such as wire (or nanowire), sheet (or nanosheet), bar (or nanobar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Inner spacer features 206 are formed between the gate structure 250 and the source/drain features 500 to provide protection and ensure proper isolation. Note that the gate structure 250 is illustrated as a transparent feature in FIG. 1A in order to illustrate the features (such as the semiconductor layers 120) that the gate structure 250 covers. FIGS. 1A and 1B have been abbreviated to provide a general picture of the device 100, and do not include all details. These details, along with additional details are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the fin structure 104 is located above the top surface of the isolation features 150. In the depicted embodiment, the device 100 further includes gate spacer layers 202 on both sides of the gate structures 250; contact etch stop layers 220 over the epitaxial source/drain features 500; and interlayer dielectric (ILD) layer 350 over the epitaxial source/drain features 500 and over the contact etch stop layers 220.

Figure 2A:
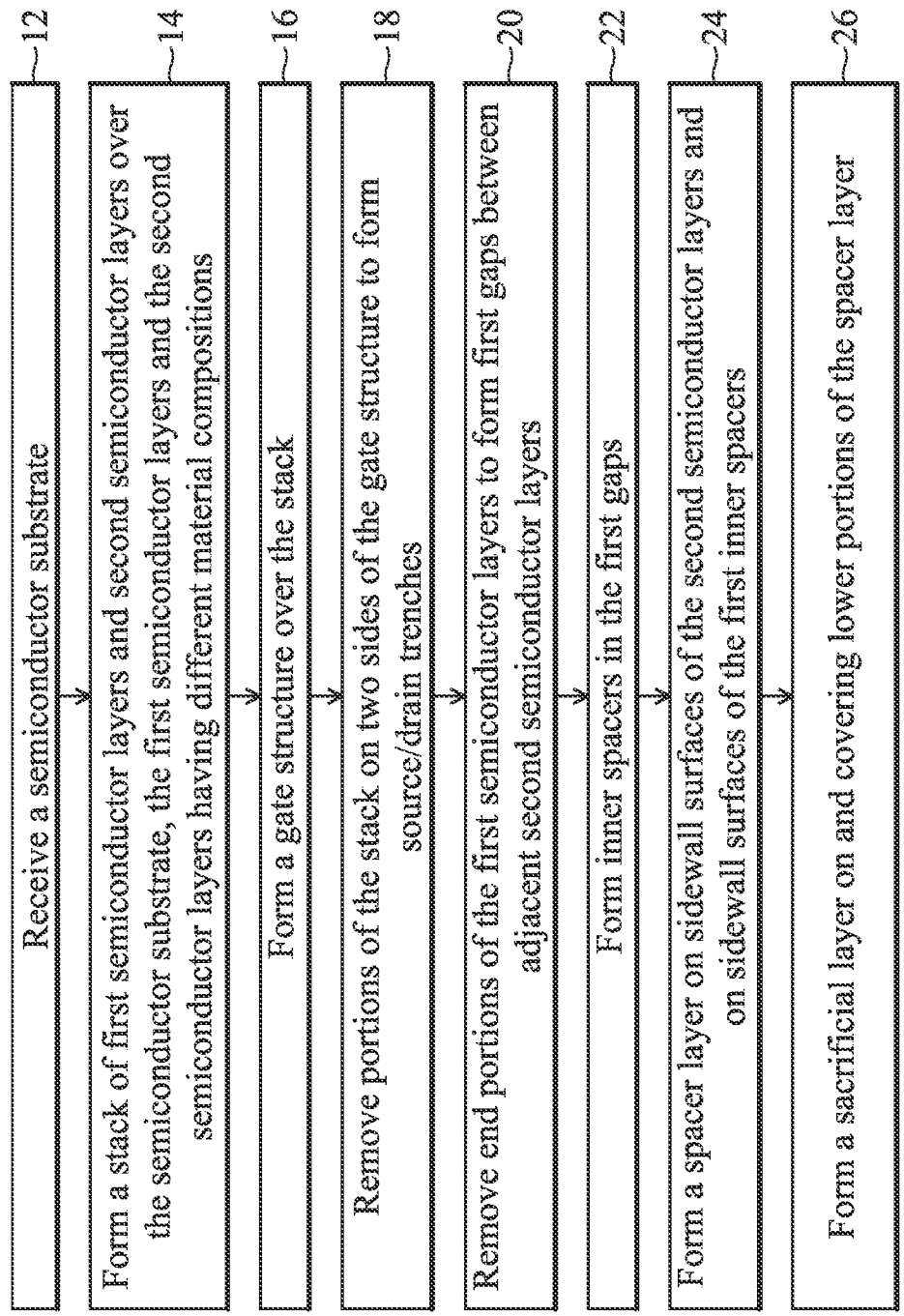
FIGS. 2A and 2B are flow charts of an example method for fabricating an embodiment of a nanosheet-based devices of the present disclosure according to some embodiments of the present disclosure.
Figure 2B:
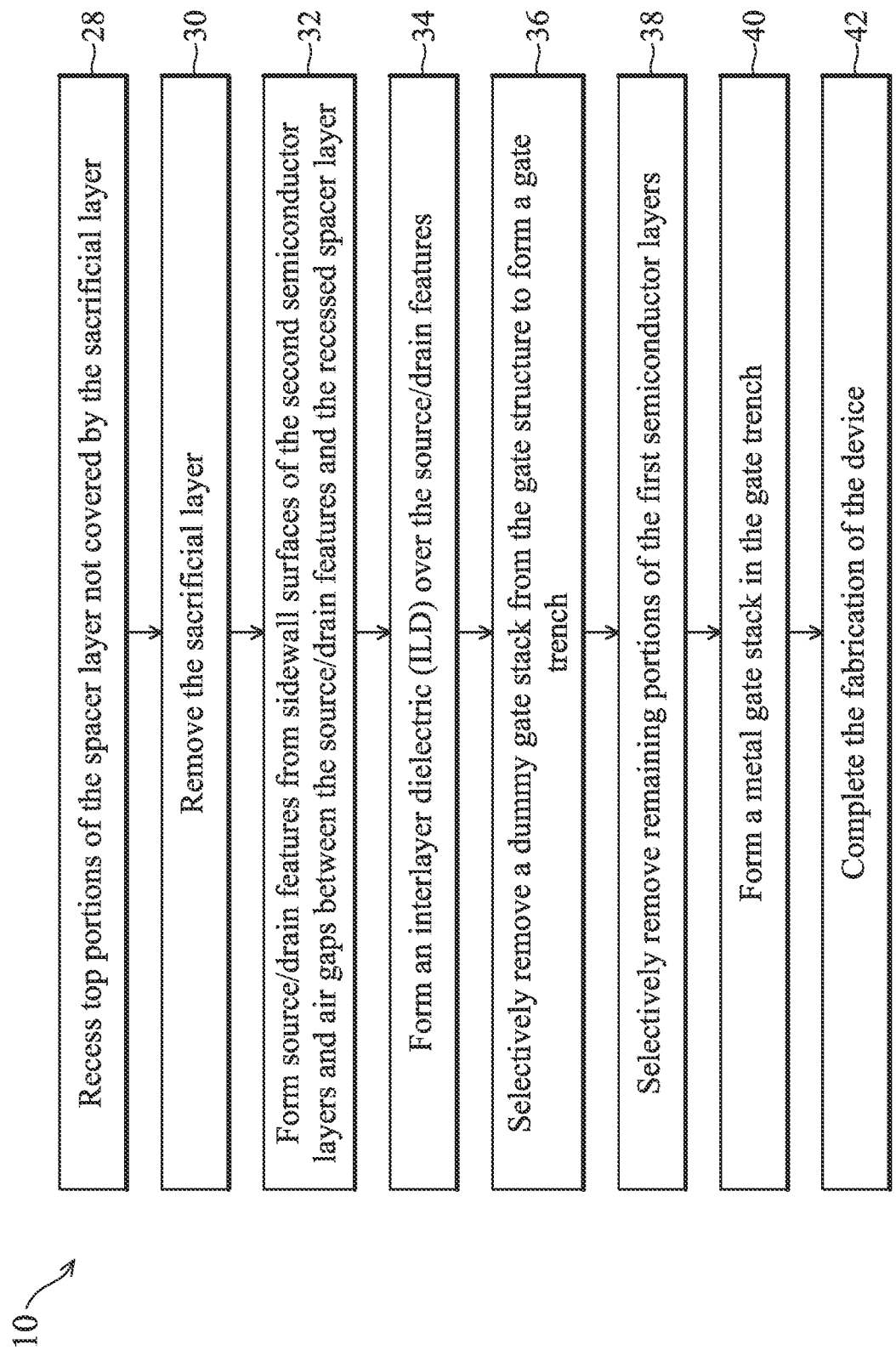

FIGS. 2A-2B are flow charts illustrating an example method 10 for fabricating a device 100 of the present disclosure according to some embodiments of the present disclosure. FIGS. 3-14 are cross-sectional views of the device along the line A-A' in FIG. 1A constructed at various fabrication stages according to embodiments of the method 10.

Figure 3:
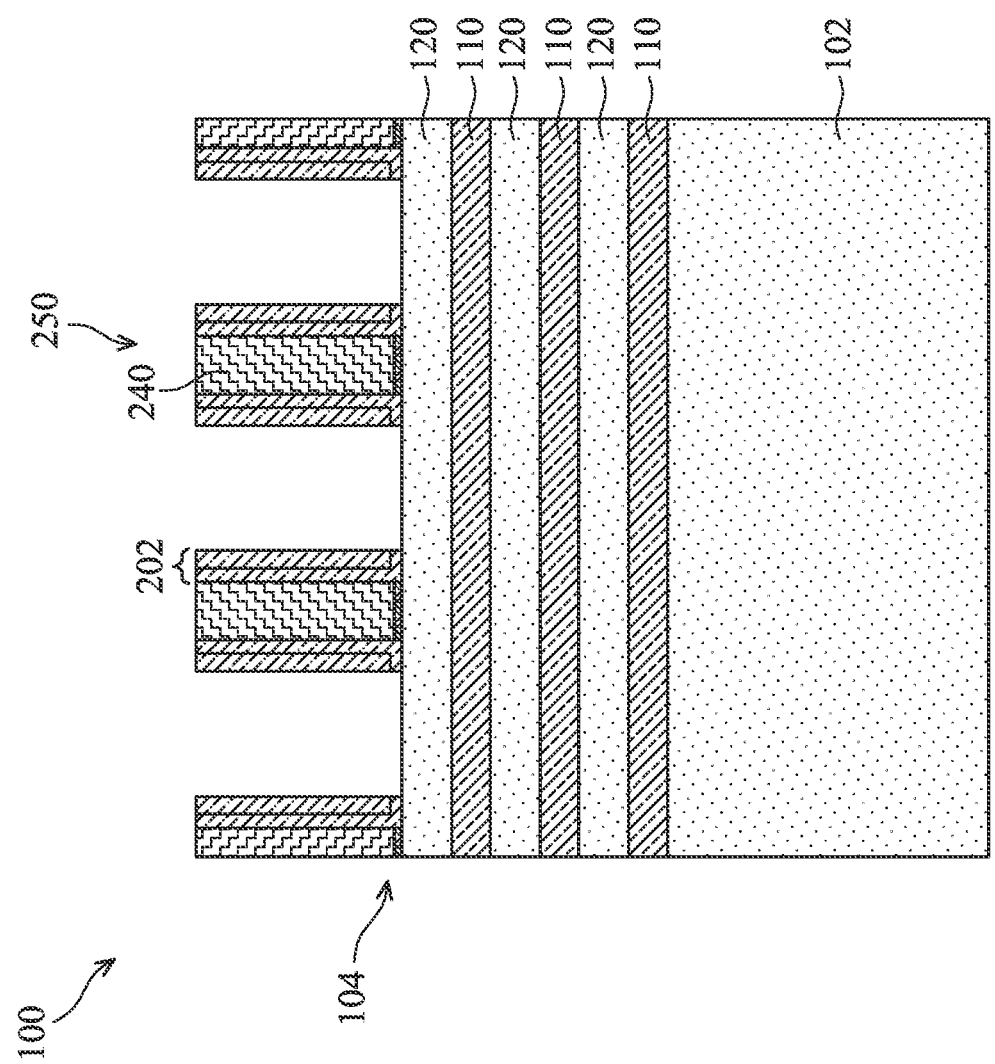

Referring to block 12 of FIG. 2A and FIG. 3, the device 100 includes a substrate 102. The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below illustrate the fabrication of an NMOS device 100 as an example. The same or similar methods may be implemented for PMOS devices or CMOS devices.

Referring to block 14 of FIG. 2A and FIG. 3, a stack of semiconductor layers is formed over the substrate 102. The stack of semiconductor layers includes semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in the depicted embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet some other embodiments, the semiconductor layers 120 and 110 both contain SiGe, but have different Ge atomic concentrations. The semiconductor layers 110 may each have a same or different thickness from each other, and from thickness(es) of the semiconductor layers 120. In some embodiments, the semiconductor layers 110 and 120 may each have a thickness of about 5 nm to about 20 nm, such as about 7 nm to about 13 nm. If the thickness of the semiconductor layers 120 too small, the device resistance may be too high; if the thickness of the semiconductor layers 120 too large, gate control of certain portions of the transistor channel may not be sufficient. If the thickness of the semiconductors 110 too small, there may not sufficient spaces for the forming of gate layers; if the thickness of the semiconductor layers 110 too large, any benefit is offset by the increased material cost and reduced efficiency.

The stacks of semiconductor layers are patterned into a plurality of fin structures 104 such that they each extend along the X-direction. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

Referring to block 16 of FIG. 2A and FIG. 3, gate structures 250 are formed over a portion of each of the fin structures 104. In some embodiments, the gate structures 250 are also formed over the isolation features 150 (see FIG. 1A) in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy electrode layer, as well as one or more hard mask layers used to pattern the dummy gate electrode layer. In some embodiments, the dummy electrode layer includes polysilicon. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Gate spacers 202 are formed on the sidewalls of the dummy gate stacks 240. In the depicted embodiment, a gate spacer layer 202 is formed over the top surface of the device. The gate spacer layers 202 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacers 202 may include multiple sub-layers each having a different material. In some embodiments, the gate spacer layers 202 may have a thickness in the range of a few nanometers (nm). In some embodiments, the gate spacer layers 202 may be formed by depositing a spacer layer (containing the dielectric material) over the dummy gate stacks 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 202. In some embodiments, the anisotropic etching process is a dry (e.g. plasma) etching process. Additionally or alternatively, the formation of the gate spacer layers 202 may also involve chemical oxidation, thermal oxidation, ALD, CVD, and/or other suitable methods.

Figure 4:
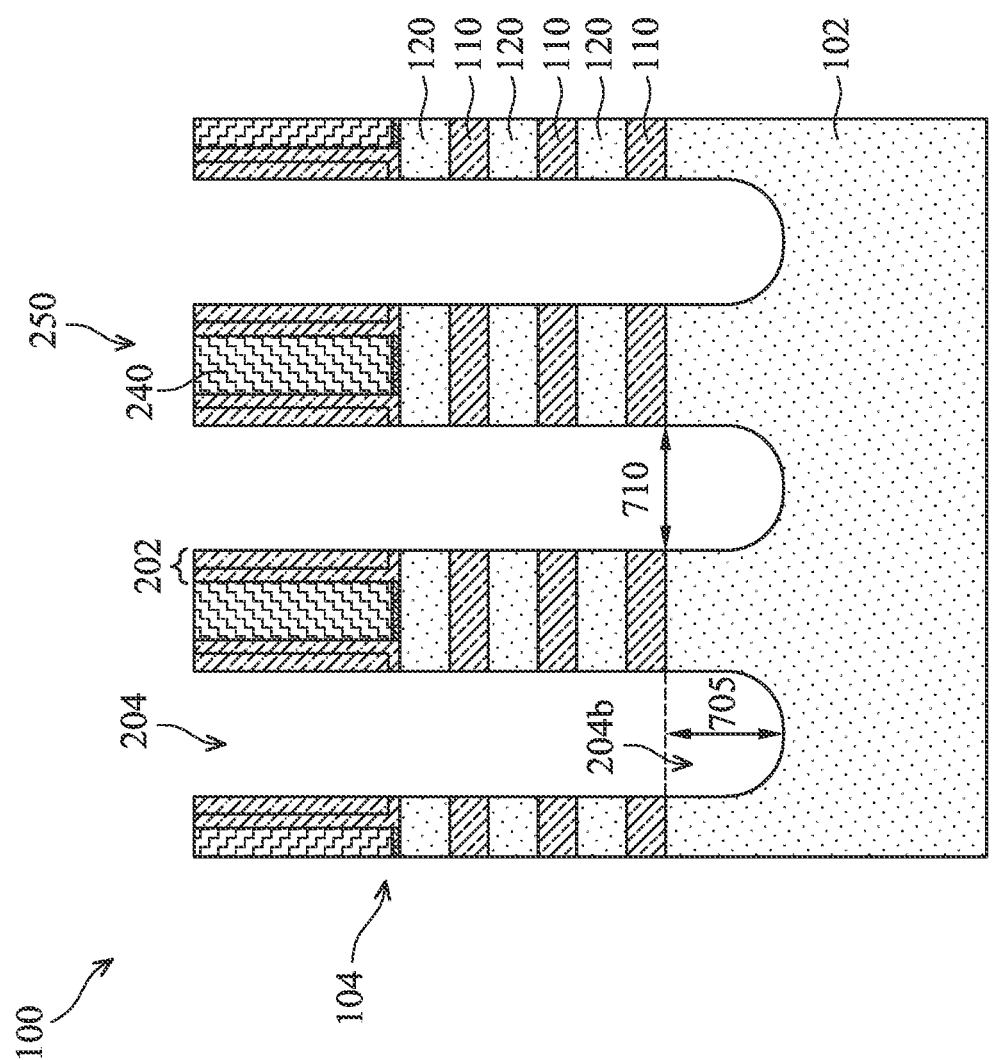

Referring to block 18 of FIG. 2A and FIG. 4, portions of the fin structure 104 adjacent to and exposed by the gate structures 250 (e.g. in the source/drain regions 104a, see FIGS. 1A and 1B) are at least partially recessed (or etched away) to form the source/drain trenches 204. Meanwhile, the portions of the fin structure 104 underneath the gate structures 250 remain intact. Additional mask elements (such as photoresists) may also be employed to protect areas not designed to be removed during the process. In the depicted embodiments, the process removes not only the exposed portions of fin structure 104, but also a portion of the underlying substrate 102. Accordingly, the source/drain trenches 204 extends below the top surface of the substrate 102. The bottom portion of the source/drain trenches 204 below the top surface of the substrate 102 are hereinafter referred to as trench portions 204b. The trench portions 204b are also below the lowest layer of subsequently formed channel layers. Accordingly, the trench portions 204b may be referred to as the "sub-channel" portion of the source/drain trench 204. The process may include multiple lithography and etching steps, and may use any suitable methods, such as dry etching and/or wet etching. In some embodiments, the trenches 204b has a profile that resembles the "U" letter although the two prongs of the "U" may be curved, and the bottom of the "U" may be less rounded thereby more resembling a "V" (as described in more details later). However, the present disclosure contemplates trench portions 204b that have any suitable profiles. In some embodiments, the top surface of the trench portions 204b may have a width 710 along the X-direction. This dimension determines a lateral dimension of the subsequently formed source/drain features. In some embodiments, the width 710 may be about 10 nm to about 30 nm. If the width 710 is too small, such as less than about 10 nm, the source/drain features formed therein may not provide sufficient charge carriers to function as designed. If the width 710 is too large, such as greater than about 30 nm, any benefit may be offset by the increase in the chip footprint and the loss of efficiency due to that. Moreover, the trench portions 204b may have a height dimension 705, measured from the bottom surface of the source/drain trench 204 and the bottom surface of the bottommost semiconductor layer 110. As described in detail later, the height dimension 705 at least partially determines the height dimension of a subsequently formed air gap that separates the source/drain features from the substrate. In some embodiments, the height dimension 705 may be about 0.2 nm to about 50 nm, such as about 20 nm to about 50 nm. If the height dimension 705 is too small, the air gap may be too small to prevent merging of the source/drain features with the substrate; if the height dimension 705 is too large, the air gap may be too large such that structural integrity may be compromised in subsequent processing.

The formation of the source/drain trenches 204 exposes sidewalls of the stack of semiconductor layers 110 and 120. Referring to block 20 of FIG. 2A and FIG. 5, portions of the semiconductor layers 110 are removed through the exposed sidewall surfaces in the source/drain trenches 204 via a selective etching process. Because the selective etching process recesses the semiconductor layers 110 in a lateral direction along the X-direction, it may sometimes be referred to as a lateral etching process, or a lateral recessing process. The selective etching process is designed to remove end portions of the semiconductor layers 110 but only minimally (or not) affect the semiconductor layers 120. For example, two end portions of the semiconductor layers 110 may be removed to form respective openings 205, while the end portions of the semiconductor layers 120 directly above and below the removed end portions of the semiconductor layers 110 (hence above and below the openings 205) are substantially preserved. Therefore, openings 205 are formed between the vertically adjacent semiconductor layers 120.

Figure 5:
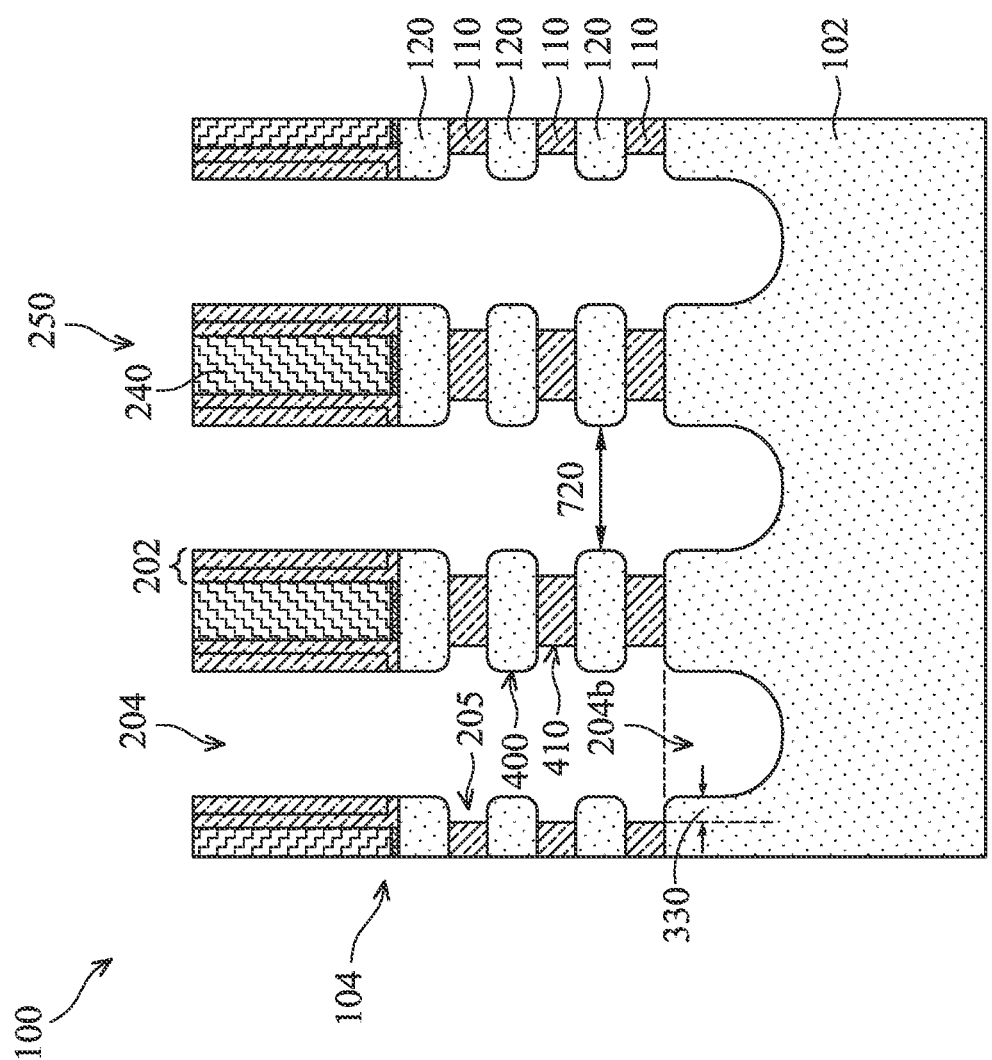

The openings 205 formed during the selective etching process extend the source/drain trenches 204 into areas beneath and between the semiconductor layers 120 and under the gate spacer layers 202. The extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205 has a depth 330 along the X-direction. In some embodiments, the depth 330 is defined by the distance between the sidewall surfaces of the etched semiconductor layers 110 and the plane along which the sidewall surface of the semiconductor layers 120 extends. In some embodiments, the etching process conditions cause the openings 205 to have curved surfaces. For example, as illustrated in FIG. 5, the remaining portions of the semiconductor layers 110 may have a concave surface 410 facing the openings 205. Accordingly, the openings 205 may have a larger width (along the X-direction) at its mid-height (along the Z-direction) than at its top or bottom interfaces with the semiconductor layers 120 or with the substrate 102. In some embodiments, however, the remaining portions of the semiconductor layers 110 may instead have approximately straight (or flat surfaces).

The selective etching process may be any suitable processes. In the depicted embodiments, the semiconductor layers 120 include Si and the semiconductor layers 110 include SiGe. The selective etching process may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters. Additionally, the sidewalls of the semiconductor layers 120 may also have curved surfaces after the selective etching process completes. As described above, although the semiconductor layers 120 are largely preserved due to their etching resistance to the etching chemical, they nevertheless may have their profiles slightly modified, particularly in their end portions above and below the openings 205. For example, prior to the selective etching process, these end portions may have substantially straight sidewall surfaces (see FIG. 4). After the selective etching process, the sidewall surfaces become more rounded and with a convex profile facing the source/drain trenches 204. The sidewall surface after the selective etching process is referred to as surface 400. In other words, the semiconductor layers 120 may have a larger length along the X-direction at its mid-height (along the Z-direction) than at its top or bottom interfaces with the semiconductor layers 110 (and the openings 205). In some embodiments, opposing surfaces 400 of adjacent semiconductor layers 110 are separated by a distance (or separation) 720. In some embodiments, the separation 720 is about 10 nm to about 30 nm, similar to the separation 710 of FIG. 5. In some embodiments, however, the surfaces 400 may instead be straight (or flat). In still some embodiments, the surface 400 may instead be convex facing away from the source/drain trenches 204.

Figure 6:
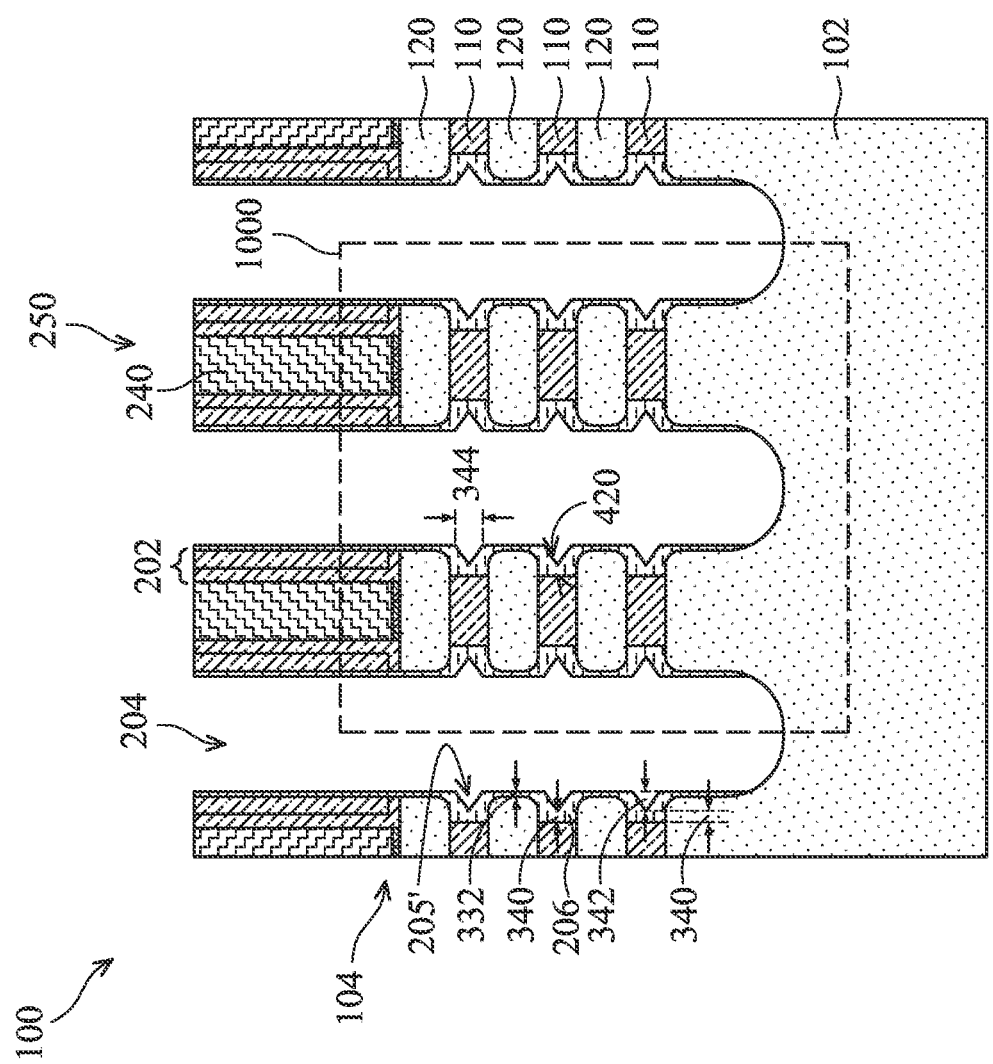

Referring to block 22 of FIG. 2A and FIG. 6, inner spacers 206 are formed in the source/drain trenches 204 and in the openings 205. In some embodiments, a dielectric material is deposited into both the source/drain trenches 204 and the openings 205 and subsequently partially removed to form the inner spacers 206. In an embodiment, the dielectric material may be selected from $SiO_2$, SiON, SiOC, SiOCN, or combinations thereof. In some embodiments, the proper selection of the dielectric material may be based on its dielectric constant. The deposition of the dielectric material may be any suitable methods, such as CVD, PVD, PECVD, MOCVD, ALD, PEALD, or combinations thereof. In some embodiments, the partial etching-back does not completely remove the dielectric materials within the original source/ drain trenches 204, and also removes a portion, but not all, of the dielectric materials within the original openings 205 (compare FIG. 5). For example, a layer of the dielectric material, having a lateral width 332, remains on sidewall surfaces of the semiconductor layers 120 at the end of the selective etching process. Alternatively, in some embodiments, no dielectric material remains on the sidewall surfaces of the semiconductor layers 120. In other words, the lateral width 332 (or thickness 332) may be zero. The dielectric materials remaining in the openings 205 become the inner spacers 206. Accordingly, the inner spacers 206 are formed between vertically adjacent end portions of the semiconductor layers 120. Alternatively or additionally, a masking element may also be used.

The inner spacers 206 interface with the remaining portions of the semiconductor layers 110 at the surface 410 (see FIG. 5). Additionally, the inner spacers 206 have a new surface 420 exposed in the source/drain trenches 204. The distance between the surfaces 410 and 420 defines the profiles and the lateral width 340 of the inner spacers 206. The new surface 420 may be of a same or different profile as that of the surface 410. When the surfaces 410 and 420 have different profiles, the inner spacers 206 may have varying lateral widths at different heights of the inner spacers 206 along the Z-direction. In such embodiments, the lateral width 340 represents the lateral width of the inner spacers 206 along the X-direction at the respective half-height along the Z-direction. In some embodiments, the lateral width 340 is about 1 nm to about 5 nm. In some embodiments, the sidewall surfaces 420 define new openings 205' between portions of the inner spacers 206. In some embodiments, the openings 205' may have a lateral width 342, measured from the distance (along the X-direction) between the sidewall surface of the inner spacer 206 at its half-height and the plane along which the outmost edge of the inner spacers 206 extends. In some embodiments, the lateral width 342 may be about 0.2 nm to about 7 nm. The lateral width 342 partially defines a lateral width of a subsequently formed spacer feature as described below. Moreover, the openings 205' may have a height dimension 344 between portions of the outmost edge of the inner spacers 206. In some embodiments, the height dimension 344 may be about 0.2 nm to about 7 nm. The height dimension 344 partially defines a height dimension of a subsequently formed spacer feature as described below. If the height dimension 344 is too large, the inner spacer 206 may be too thin to provide the necessary protection towards subsequently formed source/drain features. If the height dimension 344 is too small, it may be challenging to form second spacers (as described later) that substantially fills the openings, thereby leaving voids that also affect the effectiveness of the protection in the subsequent channel release processes.

In the depicted embodiment of FIG. 6, the remaining portions of the openings 205 have triangular shapes. In some embodiments, the profile of these remaining portions of the openings 205 define shapes of the subsequently formed spacer features therein. In some embodiments, conditions of the partial etch-back for the dielectric material (that forms the inner spacers 206) may be controlled to adjust the sidewall profile of the inner spacers 206, and thereby adjusting the profiles for the subsequently formed spacer feature. Although FIG. 6 only illustrates the triangular shape, any other suitable shapes such as rectangular, trapezoidal, pentagonal, squares, rounded rectangular, rounded trapezoidal, rounded pentagonal, rounded squares, ellipses, circles, are contemplated.

Figure 7:
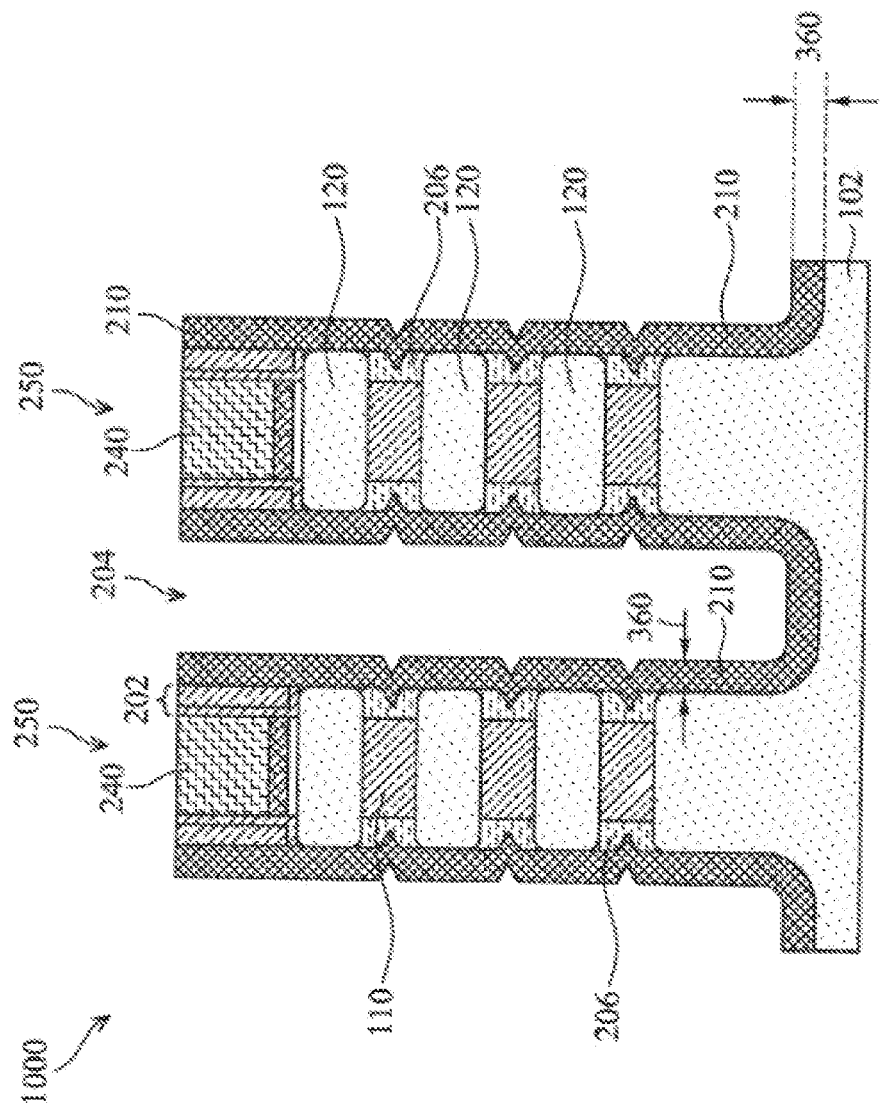

FIG. 7 illustrates an expanded view of the portion 1000 of device 100 of FIG. 6. Referring to block 24 of FIG. 2A and FIG. 7, a spacer layer 210 is formed on the device 100 covering sidewall surfaces of the inner spacers 206 and sidewall surfaces of the semiconductor layers 120. Moreover, the spacer layer 210 are formed on sidewall surfaces and the bottom surface of the trench portions 204b. Any suitable methods may be used to form the spacer layer 210. In the depicted embodiments, the spacer layer 210 is formed using atomic layer deposition (ALD). Alternatively, the spacer layer 210 may be formed using CVD, PVD, other suitable methods, or combinations thereof. In the depicted embodiments, the spacer layer 210 is a conformal layer having a thickness 360. Accordingly, the spacer layers 210 includes dents on the exposed surfaces laterally aligned with the original openings 205. In some embodiments, the thickness 360 of the spacer layer 210 is about 0.2 nm to about 7 nm. In some embodiments, the thickness 360 of the spacer layer 210 is about 1 nm to about 5 nm. As described later, the spacer layers 210 are used to assist the formation of air gaps between the bottom surfaces of the source/drain trenches 204 and the bottom surfaces of the source/drain features formed therein thereby preventing source/drain feature growths from the substrate material in the trench portions 204b. If the thickness 360 is too small, in some instances, defects in the spacer layer 210 that is too thin may expose areas of the semiconductor materials such that epitaxial growth may occur within the trench portions 204b. As a result, parasitic capacitances may not be maximally reduced. Conversely, if the thickness 360 is too large, the spacer layer 210 may itself occupy too much space, leaving a relatively small air gap. As a result, parasitic capacitances likewise may not be maximally reduced. In some embodiments, the spacer layers 210 are configured to have sidewall surfaces substantially straight (or flat) across the height of the semiconductor layer stacks. In some embodiments, the deposition conditions of the spacer layers 210 may be adjusted to form the desired sidewall surface profiles. Although not explicitly depicted, where the thickness 332 (see FIG. 6) is not zero, a thin layer of dielectric material of the inner spacers 206 may also exist between sidewall surfaces of the semiconductor layers 120 and the spacer layer 210.

In some embodiments, the spacer layer 210 includes a dielectric material that has, for example, aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), any other suitable elements, or combinations thereof. In some embodiments, the spacer layer includes a nitride or an oxide. In some embodiments, the spacer layer 210 includes a material different from that of the inner spacers 206. For example, the spacer layer 210 may include a high-k dielectric material having a k value greater than 7, while the inner spacers 206 include a dielectric material having a k value less than 7. In some embodiments, having such material configurations allow better protection for the subsequently formed source/drain features in subsequent channel release processes. In some other embodiments, the spacer layer 210 may have the same material as the inner spacers 206.

Figure 8:
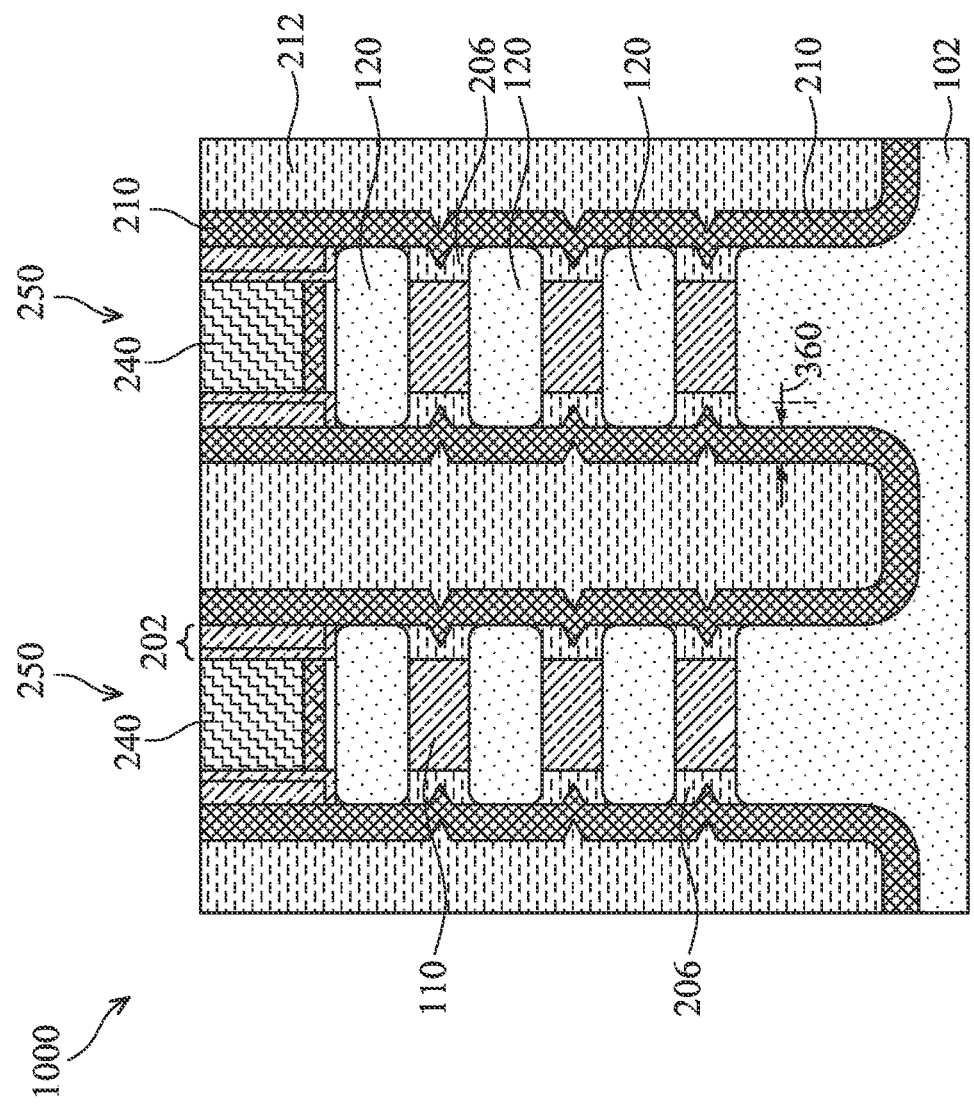

Referring to block 26 of FIG. 2A and FIG. 8, a sacrificial layer 212 is formed on and covering the device 100. In some embodiments, the sacrificial layer is a bottom anti-reflective coating (BARC) layer. The sacrificial layer 212 may be of any suitable materials. The sacrificial layer 212 may provide for absorption of radiation incident to the substrate during photolithography processes, including exposure of an overlying photoresist layer. The sacrificial layer 212 formed on the substrate may include one or more sublayers. In some embodiments, the sacrificial layer 212 may be about 60 nanometers (nm) to about 80 nm in thickness. The sacrificial layer 212 may be formed by one or more spin-on deposition processes that may be followed by one or more bake processes. In some embodiments, the sacrificial layer 212 is baked at an elevated temperature, for example, at a temperature of about 200° C. to about 230° C. In some embodiments, the baking operation removes solvent molecules within the sacrificial layer 212 and causes densification therein. Although not explicitly depicted, in some embodiments, masking elements are formed over the sacrificial layer 212 to define areas to be subsequently processed. For example, a masking element maybe formed to cover the device regions configured for p-type source/drain feature growth, while exposing device regions configured for n-type source/drain feature growth, such that processing steps described below targets only those device regions configured for the n-type source/drain feature growth.

Figure 9:
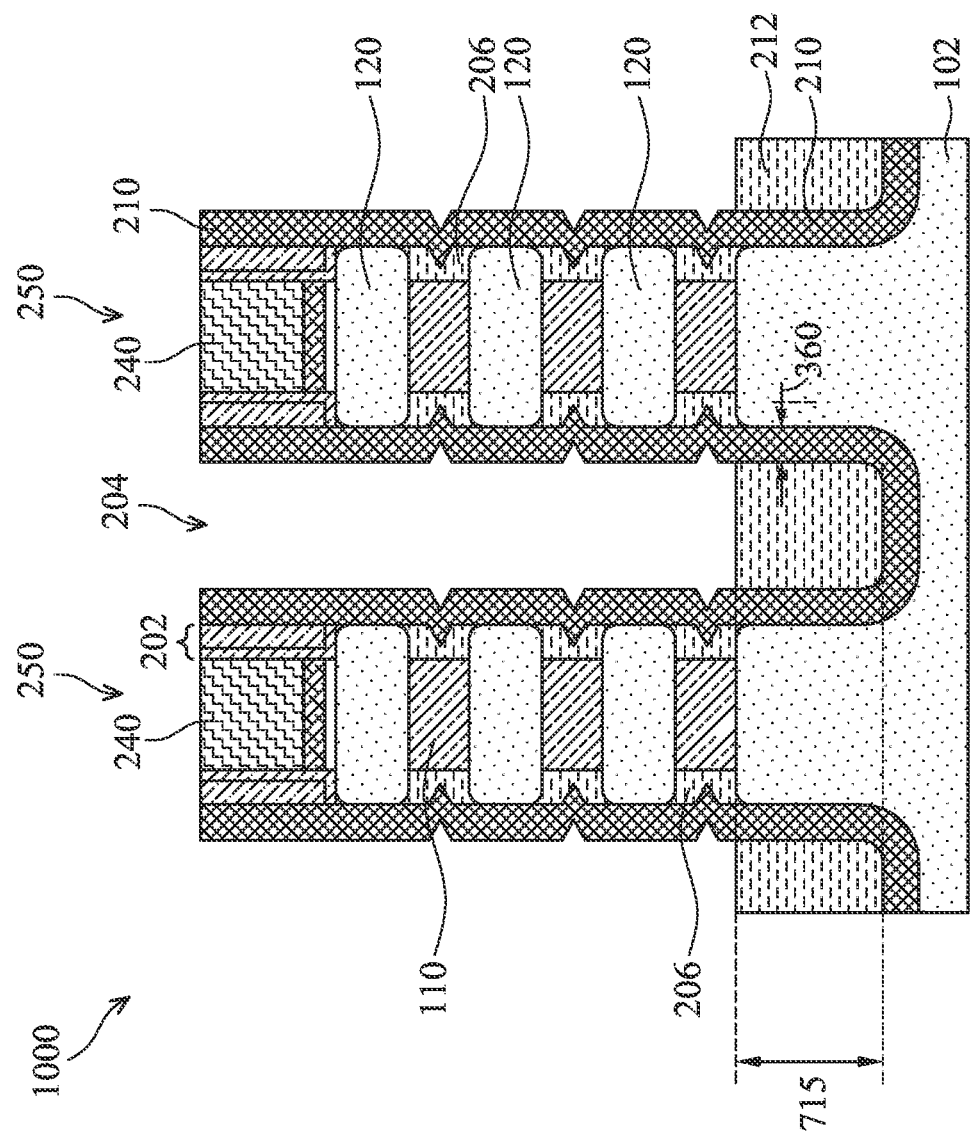

Referring to block 26 of FIG. 2A and FIG. 9, the sacrificial layer 212 is recessed. In the depicted embodiments, the recessed sacrificial layer 212 has a top surface extending along the bottom surface of the bottommost semiconductor layer 110. However, the recessed sacrificial layer 212 may have a top surface extending anywhere between a bottom surface of the bottommost semiconductor layer 110 and a top surface of the bottommost semiconductor layer 110. In some embodiments, the recessed sacrificial layer 212 has a height dimension 715. In some embodiments, the height dimension 715 is about 0.2 nm to about 50 nm. For example, the height dimension 715 may be about 20 nm to about 50 nm. Moreover, a vertical separation (along the Z-direction) between the top surface of the sacrificial layer 212 and the bottom surface of the bottommost semiconductor layers 110 may be about 5 nm to about 10 nm. If the recessed sacrificial layer 212 is too thick, such as having a top surface that extends above a top surface of the bottommost semiconductor layer, or if the vertical separation is too large, not all volumes of the semiconductor layers 120 may be used as the conductive pathway in operation, thereby unnecessarily increase the resistance. If the recessed sacrificial layer 212 is too thin, such as having a top surface that extends below a bottom surface of the bottommost semiconductor layer 110, some portion of the substrate will be exposed in the trench portion 204b after the recessing of the spacer layer 210. As described later, this reduces the effectiveness of the spacer layer 210 from preventing epitaxial growth from the substrate such that the parasitic resistances are not maximally reduced. The height dimension 715 of the sacrificial layer 212 may be controlled by any suitable methods, such as by adjusting a time duration of the recessing operation.

Figure 10:
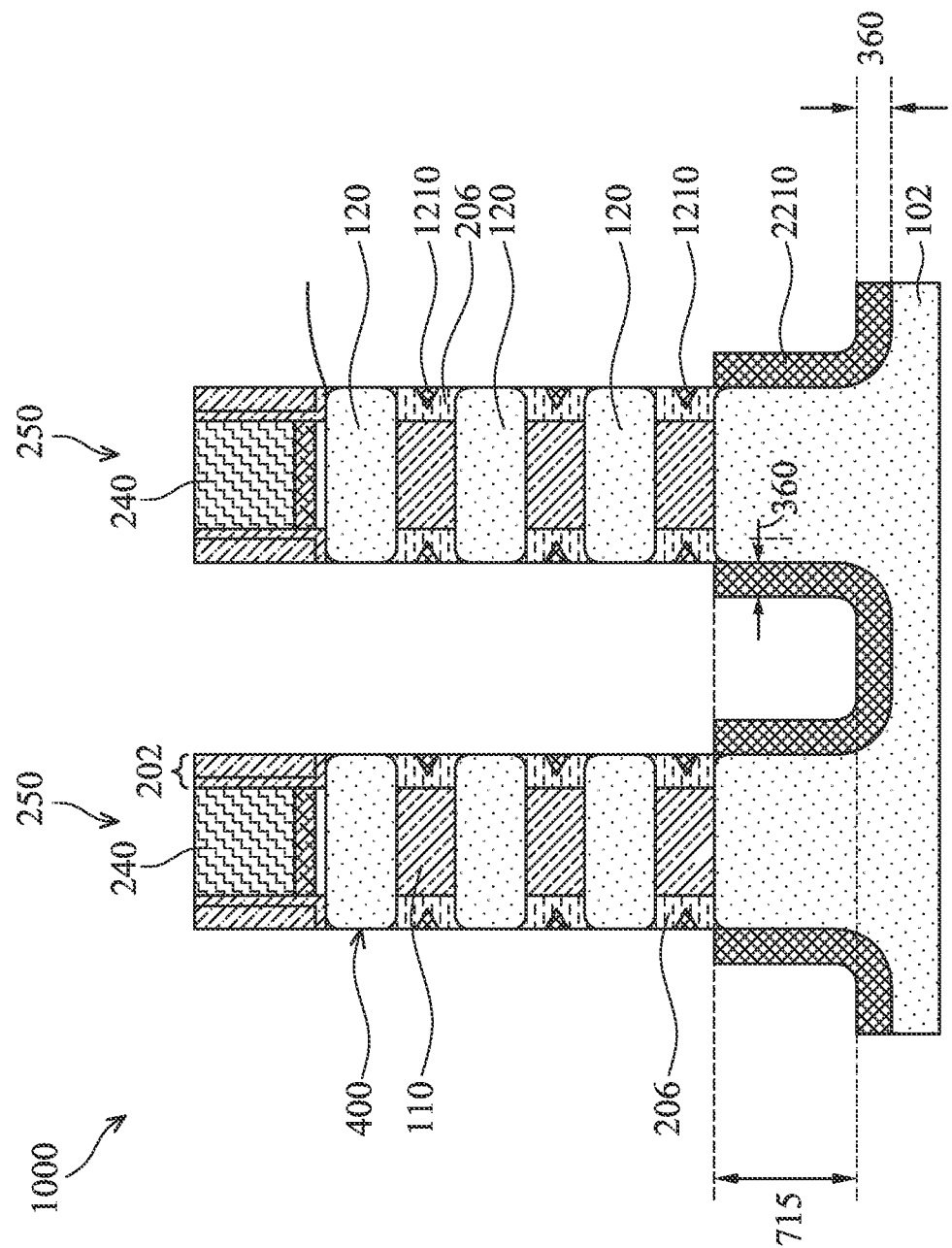

Referring to block 28 of FIG. 2B and FIG. 10, the top portions of the spacer layer 210 not covered by the recessed sacrificial layer 212 is recessed such that it has a height dimension corresponding to a sum of the height 715 of the recessed sacrificial layer 212 and its own thickness 360. In other words, the portions of the spacer layer 210 on sidewall surfaces of all semiconductor layers 120 and 110 are removed. Moreover, where the thickness 332 (see FIG. 6) is not zero, any remaining dielectric material of the inner spacers 206 between sidewall surfaces of the semiconductor layers 120 and the spacer layer 210 are also removed during the process. As described earlier, in some embodiments, the recessed sacrificial layer 212 may extend higher than the bottom surface of the bottommost semiconductor layer 110. In such embodiments, there may be a portion of the spacer layer 210 that remains on a bottom portion of the bottommost inner spacers 206 (which is aligned with the bottommost semiconductor layer 110). Any suitable methods may be used to recess the spacer layer 210. In some embodiments, the recessing operation may be a wet cleaning process that selectively etches the dielectric materials of the spacer layer 210 without substantially affecting the semiconductor layers 120. Moreover, in some embodiments, the recessing operation may be further configured such that there is a selectivity between the dielectric materials of the spacer layer 210 relative to the inner spacers 206 to avoid damages thereof. Accordingly, at the end of the removing operation, a recessed spacer layer 210, or referred to the blocking layer 2210, remains. The blocking layer 2210 may adopt the profile of the trench portions 204b, such that it resembles the "U" shape described above. The blocking layer 2210 covers the surfaces of the substrate (having the semiconductor materials) in the trench portions 204b (and may also cover a portion of the sidewall surfaces of the bottommost semiconductor layers 110). The remaining spaces of the trench portions 204b are occupied by the recessed sacrificial layer 212. In the depicted embodiments, portions of the spacer layer 210 in spaces between two prongs of the "V"-shaped inner spacers 206 may survive the recessing operation and persist through the subsequent processing. Accordingly, second inner spacers 1210 are formed and fills the part of the previous openings 205' (see FIG. 6). As described later, such second inner spacers 1210 provides improved protection for source/drain features. Alternatively, in some other embodiments, the recessing operation is configured to remove any materials in spaces between the two prongs of the "V"-shaped inner spacers 206. As described later, such an approach may have the benefit of reduced capacitances in some circumstances.

As illustrated in FIG. 10, following the recessing operation of the spacer layer 210, the sidewall surfaces 400 of the semiconductor layers 120 are exposed. Although FIG. 10 depicts the sidewall surfaces of the inner spacers 206, the second inner spacers 1210 to each have sidewall surfaces aligned with sidewall surfaces of the semiconductor layers 120, in some embodiments, such sidewall surfaces may instead extend beyond the vertical plane along which the sidewall surfaces 400 extend. In some other embodiments, such sidewall surfaces of the inner spacers 206 and second inner spacers 1210 may not reach the plane along which the sidewall surfaces 400 extend.

At this processing stage, the method 10 proceeds to block 30 of FIG. 2B, where any remaining portions of the sacrificial layer 212 is removed. Any suitable methods may be used. In some embodiments, ashing operation may be used to remove the sacrificial layer 212. For example, the ashing process may include an oxygen-containing plasma. Accordingly, inner surfaces of "U"-shaped spacer blocking layer 2210 (e.g. the top and sidewall surfaces of the blocking layer 2210) become exposed in the trench portions 204b. As described above, the blocking layer 2210 directly contacts the substrates and covers any semiconductor materials therein.

Figure 11A:
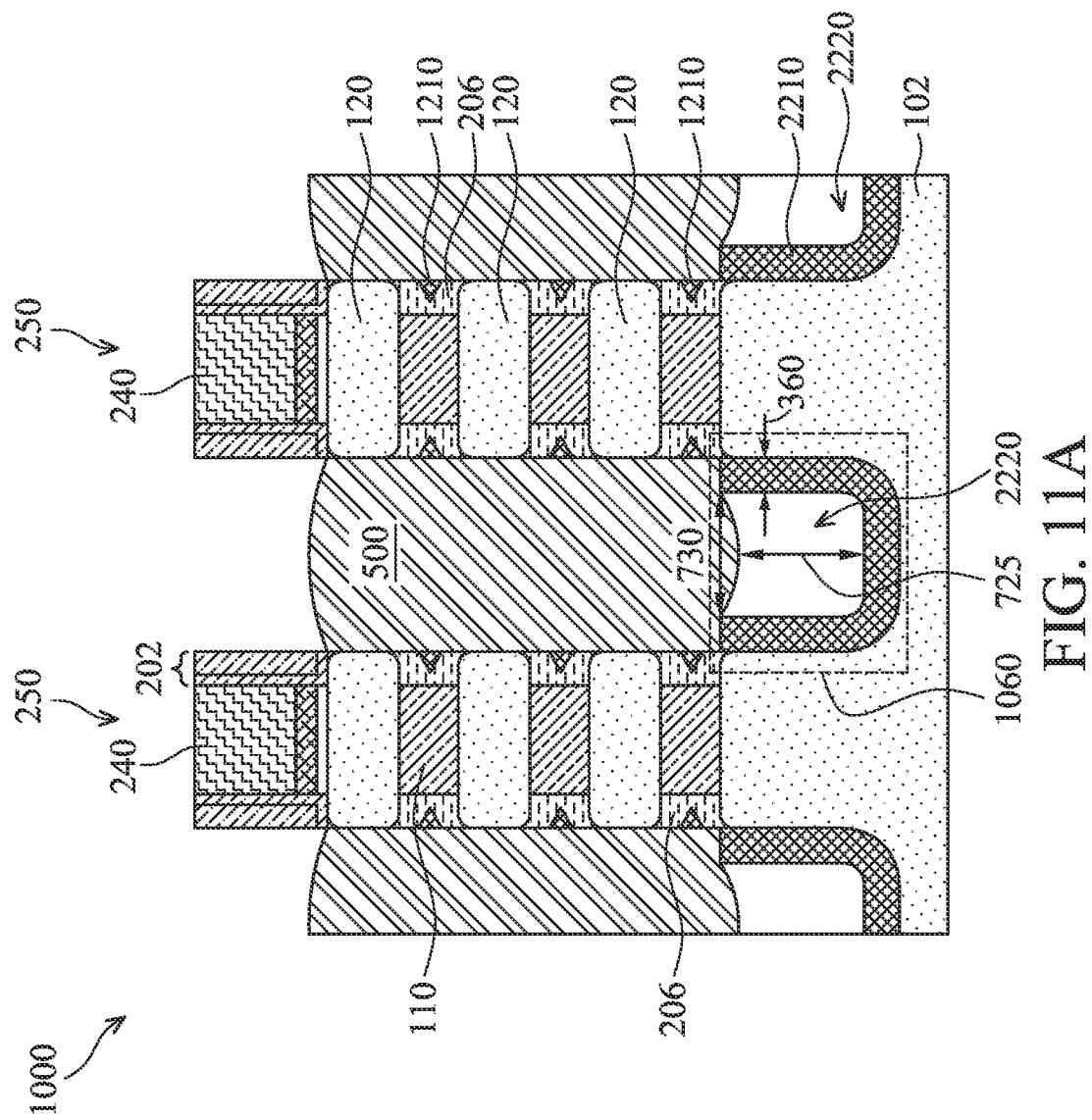

Referring to block 32 of FIG. 2B and FIG. 11A, the method 10 proceeds to form epitaxial source/drain features 500 in the source/drain trenches 204, and partially fill the source/drain trenches 204. Although not explicitly depicted, the epitaxial source/drain features 500 may include one or more than one layers. In some embodiments, different layers of the epitaxial source/drain features 500 may have different semiconductor materials and/or different dopant compositions. As described in more details below, air gaps 2220 are formed between the source/drain features 500 and the substrate 102 (such as between the bottom surfaces of the source/drain features 500 and the surfaces of the layers 2210 exposed in the source/drain trench portions 204b). In some embodiments, the device 100 is configured as an n-type device. Accordingly, the source/drain features 500 include n-type semiconductor materials, such as silicon. Furthermore, the source/drain features 500 (or a portion thereof) includes a dopant element. The doping improves the mobility of charge carriers that migrate from one source/drain features 500 through the semiconductor layers 120 to another source/drain features 500 during the operation. For example, the dopant may include Arsenic (As), phosphorous (P), antimony (Sb), bismuth (Bi), or combinations thereof. In some embodiments, the device 100 is configured as a p-type device. Accordingly, the source/drain features 500 include p-type semiconductor materials, such as Si, silicon germanium (SiGe), germanium (Ge), or combinations thereof. Moreover, the source/drain features 500 may further include a p-type dopant element, such as boron (B), boron fluoride ($BF_2$), gallium (Ga), other suitable p-type dopants, or combinations thereof.

In some embodiments, the source/drain features 500 are formed by an epitaxial process. The epitaxial process may include performing an epitaxial deposition/partial etch process and repeating the epitaxial deposition/partial etch process. Accordingly, the epitaxial process is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial process may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer (as a part of the source/drain features 500) is reached. In some embodiments, the epitaxial process may instead be a selective epitaxial growth (SEG) process. The selective epitaxial growth process utilizes simultaneous deposition and etch operations. In some embodiments, the epitaxial process 600 may include both CDE operations and SEG operations.

Generally, the growth of the semiconductor epitaxy initiates from surfaces of the semiconductor materials and does not initiate from dielectric materials. At the beginning of the epitaxial process, only exposed semiconductor materials are on the sidewall surfaces 400 of the semiconductor layers 120 (see FIG. 10). Accordingly, the growth of the source/drain features 500 initiates laterally from the surfaces 400 of the semiconductor layers 120. No growth occurs from the dielectric material of the inner spacers 206 or from the blocking layers 2210 (which covers the substrate 102). As the source/drain features 500 grow in sizes, growth fronts of the epitaxy process from adjacent surfaces eventually merge. For example, the growth fronts from vertically adjacent semiconductor layers 120 merge vertically with each other, and the growth fronts from laterally adjacent semiconductor layers 120 also merge across the source/drain trenches 204. As a result, contiguous source/drain features 500 are formed that bridges the adjacent semiconductor layers 120. Particularly, the growth of the bottom portions of the source/drain features 500 initiate from sidewall surfaces of the bottommost semiconductor layers 120 and proceed laterally to approach each other across the source/drain trenches 204. Eventually, the bottom portions of the source/drain feature 500 merge around the middle part of the source/drain trenches 204 above the blocking layer 2210. As illustrated in FIG. 11A, the growth of the source/drain features 500 may extend downwards to dip into the trench portions 204b but not filling them. Accordingly, air gaps 2220 are formed between the blocking layer 2210 and the bottom surfaces of the source/drain features 500. Because air has a minimal k value, the air gaps serve as an extremely low-k spacer and reduces the parasitic capacitances. The air gaps 2220 may have a height 725. The height 725 may be similar to or slightly less than the height dimension 715. In some embodiments, the height 725 may be about 0.2 nm to about 50 nm, for example, about 20 nm to about 50 nm. In some embodiments, a ratio of the height 725 to the height 715 may be about 0.8:1 to about 1:1. If the height 725 is too small or the ratio is too small, the parasitic capacitance may not be maximally reduced; if the height 725 is too large or if the ratio is too large, the excessively large volume of void may adversely affect structural integrity.

FIG. 11B illustrates an expanded view of the portion 1060 of FIG. 11A. As illustrated in FIG. 11B, sidewall surfaces of the air gap 2220 may have a lateral separation 730 at a height level aligned with the top surface of the blocking layer 2210. The lateral separation 730 may equal to a difference between the width 710 and twice the thickness of the blocking layer 2210. The air gap 2220 may further have a lateral separation 732 at a height level aligned with the mid-height level of the blocking layer 2210 (e.g. the height level that is below the top surface of the blocking layer 2210 by a distance equal to half of the distance 715). In the depicted embodiment of FIG. 11B, the lateral separation 732 may be about the same as the lateral separation 730. For example, a ratio of the lateral separation 732 to the lateral separation 730 may be about 0.9:1 to about 1:1. As described above, this ratio (and the general profile of the air gap) is partially determined by the profile of the trench portions 204b, and may be adjusted by adjusting conditions of the etching operation described above with respect to FIG. 5. Moreover, the profile can be further tuned by adjusting the profile of the blocking layer 2210, for example, by adjusting the conditions for the deposition of the blocking layer 210 described above with respect to FIG. 9. Of course, the profile illustrated in FIG. 11B is only an example for the possible profiles for the air gap. In some embodiments, referring to FIG. 11C, the conditions for the etching operation described above with respect to FIG. 5 may be configured to form a trench portion 204b that more resembles a "V" profile, and accordingly, with a conformal blocking layer 2210, the air gap 2220 may similarly has a "V" profile. For example, in some embodiments, the air gap 2220 has a lateral separation 730 at a height level aligned with the top surface of the blocking layer 2210. The lateral separation 730 may equal to a difference between the width 710 and twice the thickness of the blocking layer 2210. The air gap 2220 may further have a lateral separation 732 at a height level aligned with the mid-height level of the blocking layer 2210 (e.g. the height level that is below the top surface of the blocking layer 2210 by a distance equal to half of the distance 715). A ratio of the lateral separation 732 to the lateral separation 730 may be about 0.5:1 to about 0.8:1. If the ratio is too small, the efficacy of the air gap 2220 may reduce; while if the ratio is too large, the profile approaches that described in FIG. 11B.

In some approaches not implementing the methods described herein, such as without forming the blocking layer 2210 (either with a "U"-shaped profile or a "V"-shaped profile), the growth of the source/drain features 500 also initiates from the bottom surfaces of the source/drain trenches 204 (which is also an exposed surface of the substrate 102). Accordingly, epitaxial source/drain features may include portions that substantially fills the trench portions 204b. As a result, a conductive pathway is formed between the source/drain features 500 and the substrate 102. In other words, this portion of the substrate 102 serves as a bottom channel during operation. However, because the bottom channel contacts the gate structure only from its top surface, gate control is relatively weak. Accordingly, current leakage during the OFF state through the bottom channel may lead to undesirable performance degradation. By implementing the features of the present disclosure, such as the blocking layer 2210, the substrate is spaced away and isolated from the source/drain features 500 by the blocking layer 2210 and the air gaps 2220. Accordingly, the substrate can no longer function as the bottom channel, and that all channels are well-regulated during the operation by the gate structures that surround them. Current leakage in the OFF-state is therefore substantially mitigated.

As described above, the epitaxial process may include deposition and partial etching operations. In some embodiments, parameters of the deposition and etching operations may be adjusted to control the evolution of the growth fronts of the source/drain materials, and therefore modulate the size and profiles of the air gaps 2220. For example, the temperature of the deposition temperature may be about 300° C. to about 800° C. If the temperature of the deposition is too high, excessive dopant diffusions may cause selectivity loss of the epitaxial features and reflow of the epitaxial material may be challenging to control; if the temperature of the deposition is too low, the epitaxial growth may be too slow, and may in some instances include excessive amount of defects. For example, the temperature of the etching temperature may be about 300° C. to about 800° C. If the temperature of the etching is too high, selectivity between the epitaxial material and adjacent features may be degraded; if the temperature of the etching is too low, the etching efficiency may be limited due to insufficient kinetic energy available. For example, the time duration of the deposition may be about 10 s to about 250 s. The time duration of the etching may be about 5 s to about 100 s. Moreover, a ratio of the time duration of the deposition to the time duration of the etching may be about 0.1:1 to about 50:1. If the time duration of the deposition is too long, the time duration of the etching is too short, or if the ratio is too large, the epitaxial materials may merge across the source/drain trenches too early to block the material access to lower portions of the source/drain trenches; if the time duration of the deposition is too short, the time duration of the etching is too long, or if the ratio is too small, the growth of lower portions of the source/drain features 500 may not be complete and may present voids, defects, or in some instances, do not merge at all, thereby leading to device property degradation and/or failures. Furthermore, in some embodiments, the cycle number may be about 2 to about 8. If the cycle number is too small, the growth of source/drain features from lower semiconductor layers 120 may not be sufficient (for example, due to premature merging of source/drain features on higher semiconductor layers 120 preventing material access in the lower regions); if the cycle number is too large, any additional benefit may have been saturated and/or be offset by the cost associated therewith. The epitaxy material may implement any suitable precursors. In some embodiments, the epitaxy materials implement precursors that include silicon (Si), germanium (Ge), carbon (C), tin (Sn), phosphorous (P), boron (B), arsenic (As), gallium (Ga), other suitable elements, or combinations thereof. In some embodiments, the precursors may include silane ($SiH_4$), disilane ($Si_2H_6$), dichlorosilane ($SiH_2Cl_2$), germane ($GeH_4$), digermane ($Ge_2H_6$), methane ($CH_4$), tetrachlorotin (or tetrachlorostannane, $SnCl_4$), phosphine ($PH_3$), diborane ($B_2H_6$), other suitable precursors, or combinations thereof. In some embodiments, the lateral growth rate of the epitaxial materials may be adjusted or controlled by proper selection of the precursors or precursor compositions. For example, the precursor for silicon epitaxial material may include a combination of $SiH_4$ and $SiH_2Cl_2$. By adjusting a relative concentration of the $SiH_4$ relative to that of the $SiH_2Cl_2$, proper lateral growth rate (e.g., balanced with the vertical growth of the epitaxial material) may be achieved. In some embodiments, a ratio of the concentration of $SiH_4$ to the concentration of the $SiH_2Cl_2$ in the precursor may be about 1:5 to about 5:1. If the ratio is too small or too large, the growth of the epitaxial materials may be imbalanced and lead to either defects or loss of productivity.

Figure 12:
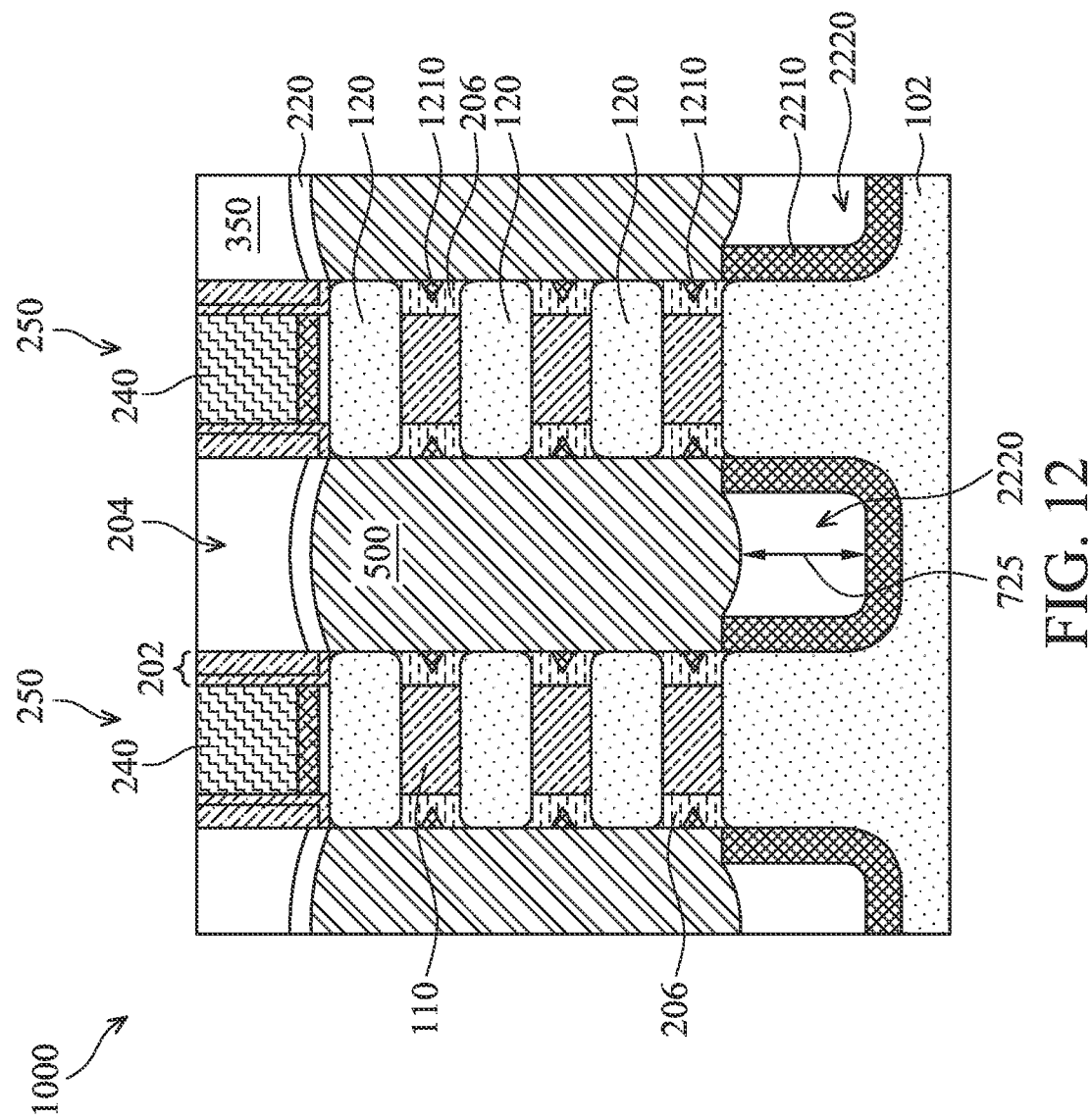

Referring to block 34 of FIG. 2 and to FIG. 12, an interlayer dielectric (ILD) layer 350 is formed over the epitaxial source/drain features 500, as well as vertically over the isolation features 150. In some embodiments, an etch-stop layer 220 may be formed in between the ILD layer 350 and the source/drain features 500. The ILD layer 350 may also be formed in between the adjacent gate structures 250 along the X-direction, and in between the adjacent epitaxial source/drain features 500 along the Y-direction. The ILD layer 350 may include a dielectric material, such as a high-k material, a low-k material, or an extreme low-k material. For example, the ILD layer 350 may include $SiO_2$, SiOC, SiON, or combinations thereof. The ILD layer 350 may include a single layer or multiple layers, and may be formed by a suitable technique, such as CVD, ALD, and/or spin-on techniques. After forming the ILD layer 350, a CMP process may be performed to remove excessive ILD layer 350 and planarized the top surface of the ILD layer 350. Among other functions, the ILD layer 350 provides electrical isolation between the various components of the device 100.

Figure 13:
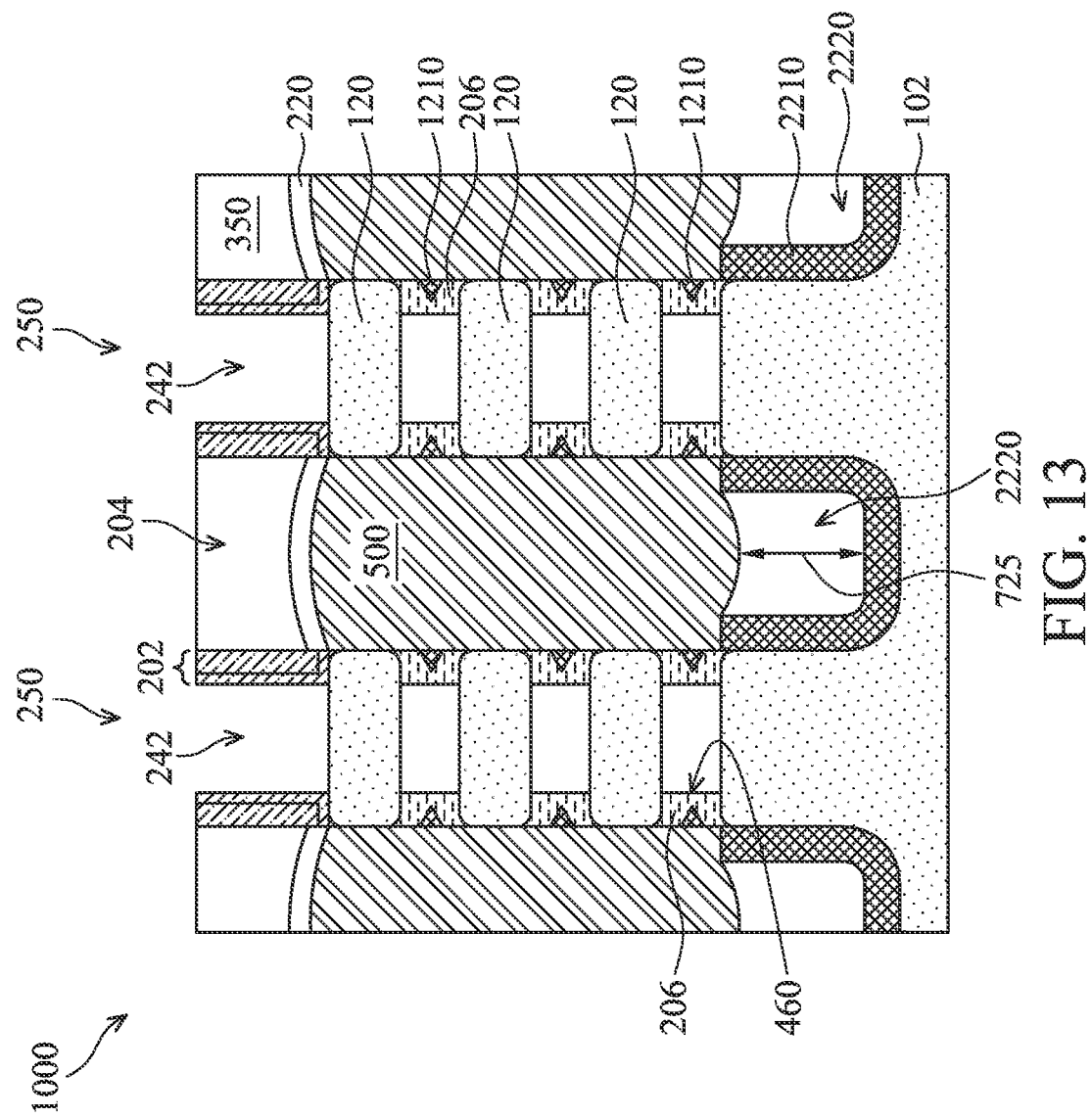

Referring to block 36 of FIG. 2B and FIG. 13, the dummy gate stacks 240 are selectively removed. The removal of the dummy gate stacks 240 creates gate trenches 242, which expose the respective top surfaces and the side surfaces of the semiconductor stacks (along the Y direction). The removal processes may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer layers 202 may be used as the masking element or a part thereof.

Referring to blocks 38 of FIG. 2B and FIG. 13, the remaining portions of the semiconductor layers 110 are selectively removed through the exposed side surfaces of the semiconductor stack. Similar to the selective etching processes described above with respect to FIG. 5, this process may be configured to completely remove the semiconductor layers 110 without substantially affect the semiconductor layers 120. The removal of the remaining portions of the semiconductor layers 110 form suspended semiconductor layers 120, as well as openings in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The semiconductor layers 120 are now "suspended" semiconductor layers 120. This process may implement any suitable etching methods, such as a dry etching method, a wet etching method, or combinations thereof. In addition to exposing top and bottom surfaces of the center portions of the semiconductor layers 120, the processes also expose the sidewall surfaces 460 of the inner spacers 206. In some embodiments, the presence of the inner spacers 1210, for example inner spacers 1210 having a high-k dielectric material, provides improved protection against potential damages to source/drain features during the process. Alternatively, however, in some other embodiments, the inner spacers 1210 may not be formed during the recessing operation. In such other embodiments, air gaps may be formed in place of the spacers 1210. Such air gaps may be beneficial for providing reduced capacitance.

Figure 14:
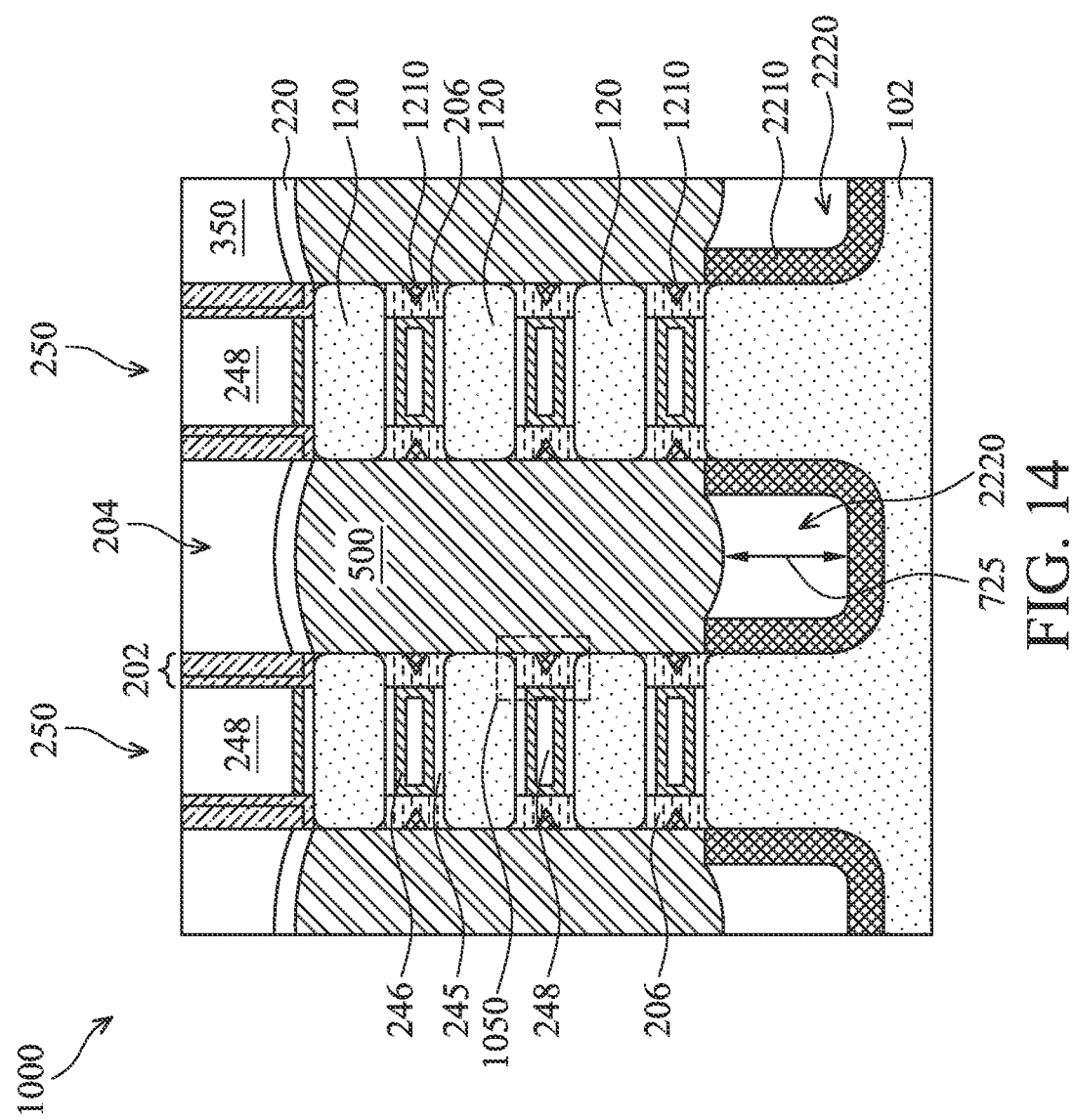

Referring to block 40 of FIG. 2B and FIG. 14, metal gate stacks are formed in the gate trenches 242 and openings between suspended semiconductor layers 120. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. The high-k gate dielectric layer 246 may be formed conformally such that it at least partially fills the gate trenches 242 and the openings. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces 410 of the inner spacers 206, and the gate spacer layers 202. The high-k gate dielectric layer 246 may contain a high-k dielectric material. For example, the high-k gate dielectric layer 246 may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof.

In some embodiments, an interfacial layer 245 is formed to interpose between the semiconductor layers 120 and the gate dielectric layers 246. Any suitable methods may be used to form the interfacial layer, such as ALD, CVD, or other deposition methods. Alternatively, the interfacial layer 245 may also be formed by an oxidation process, such as thermal oxidation or chemical oxidation. In this instance, no interfacial layer is formed on the sidewalls of the inner spacers 206 or the gate spacer layers 202. In many embodiments, the interfacial layer 245 improves the adhesion between the semiconductor substrate and the subsequently formed high-k dielectric layer 246. However, in some embodiments, the interfacial layer 245 is omitted.

The conductive metal layer 248 is formed over the gate dielectric layer 246 and fills the remaining spaces of the gate trenches 242 and the openings between suspended semiconductor layers 120. The conductive metal layer 248 may include a work function metal layer. In some embodiment, the conductive metal layer 248 is configured for the NMOS transistor. Accordingly, the work function metal layer may include any suitable n-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. In some embodiment, the conductive metal layer 248 is configured for the PMOS transistor. Accordingly, the work function metal layer may include any suitable p-type work function metal materials, such as titanium nitride (TiN), ruthenium (Ru), iridium (Jr), osmium (Os), rhodium (Rh), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 350. The gate dielectric layer 246 and the conductive metal layer 248 collectively form the high-k metal gate stack. The high-k metal gate stack and the gate spacer layers 202 collectively form the new gate structures 250. The gate structures 250 engage multiple semiconductor layers 120 to form multiple gate channels.

Figure 15A:
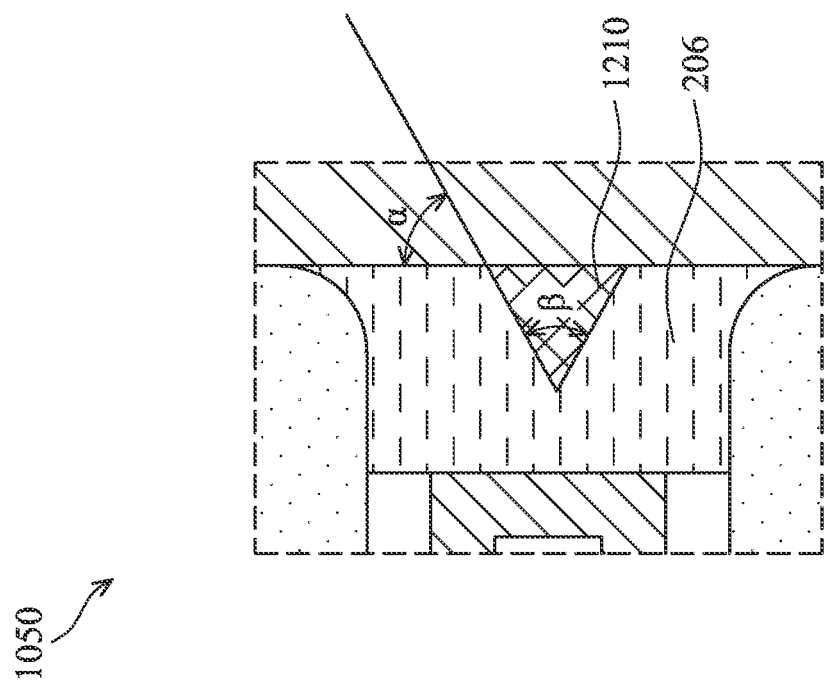

FIG. 15A provides an enlarged view of portion 1050 of the FIG. 14. Specifically, FIG. 15A further illustrates the inner spacers 206 and the inner spacers 1210. In the depicted embodiments, the inner spacers 206 has a "V" profile. Accordingly, the inner spacers 1210 has a triangular shape. In some embodiments, upper sidewall surface of the inner spacers 1210 and the lower sidewall surfaces of the inner spacers 1210 each span an angle α from the vertical direction. In some embodiments, the angle α is about 20° to about 70°. The angle α is determined by the etching-back operation described with respect to FIG. 6. If the angle α is too large, such as greater than about 70°, the complete filling of the opening 205' may have been challenging; while if the angle α is too small, such as less than about 20°, the inner spacers 1210 may be damaged or entirely removed in the etching operation described above with respect to FIG. 7. Moreover, the upper sidewall surface and the lower sidewall surface spans an angle β. The angle β may be determined by the angle α. For example, the angle β may equal to twice of (90°-α).

Figures 15B, 15C, 15D:
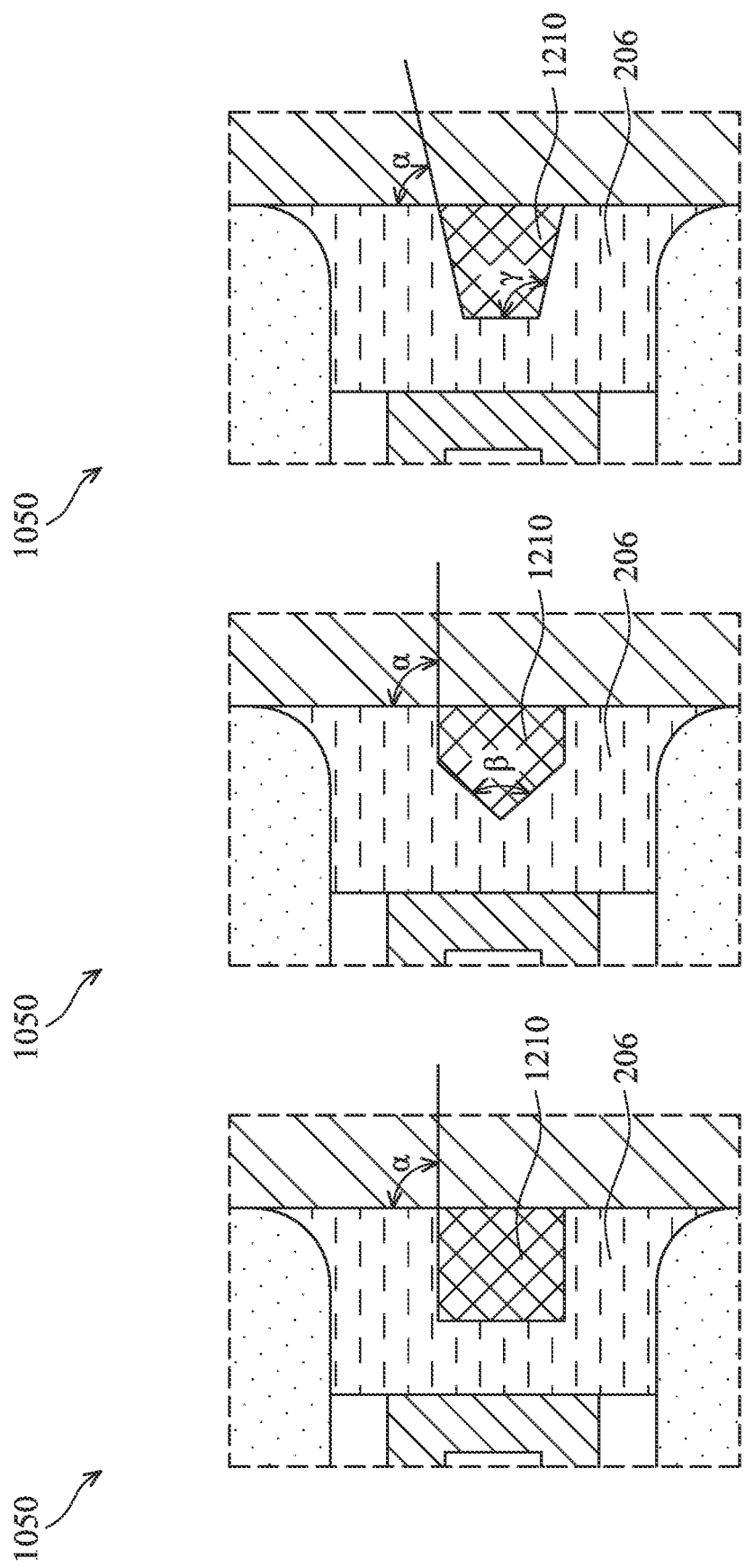

Of course, the profile described above are only examples. In some other embodiments, referring to FIG. 15B, the inner spacers 206 may instead has sidewall surfaces that resembles a "U" shape. Accordingly, the inner spacers 1210 may have a square (or semi-square) profile. In other words, the upper sidewall surface of the inner spacers 1210 and the lower sidewall surfaces of the inner spacers 1210 each span an angle α from the vertical direction, where the angle α is about 85° to about 95°. In some embodiments, having inner spacers 1210 with such a configuration ensures all areas of the source/drain features receive uniform level of protection. In still some other embodiments, referring to FIG. 15C, the inner spacers 206 may instead has sidewall surfaces that resembles an extended "V" shape. Accordingly, the inner spacers 1210 has a profile that resembles a pentagon. In other words, the upper sidewall surface of the inner spacers 1210 and the lower sidewall surfaces of the inner spacers 1210 each span an angle α from the vertical direction, where the angle α is about 85° to about 95°. Moreover, the inner spacers 1210 further includes additional sidewall surfaces that span an angle β between themselves. In some embodiments, the angle β is about 20° to about 70°. If the angle β is too large, such as greater than about 70°, the complete filling of the opening 205' may have been challenging; while if the angle β is too small, such as less than about 20°, the inner spacers 1210 may be damaged or entirely removed in the etching operation described above with respect to FIG. 7. In still some other embodiments, referring to FIG. 15D the inner spacers 206 may instead has sidewall surfaces that resembles a trapezoid (such as an isosceles trapezoid). In other words, the inner spacers 1210 has a profile that resembles a trapezoid (such as an isosceles trapezoid). In other words, the upper sidewall surface of the inner spacers 1210 and the lower sidewall surfaces of the inner spacers 1210 each span an angle α from the vertical direction, where the angle α is about 20° to about 70°. If the angle α is too large, such as greater than about 70°, the complete filling of the opening 205' may have been challenging; while if the angle α is too small, such as less than about 20°, the inner spacers 1210 may be damaged or entirely removed in the etching operation described above with respect to FIG. 7. Additional profiles are contemplated and may serve different functions based on design requirement and applications of the device.

Referring to block 42 of FIG. 2B, the method 10 proceeds to form additional necessary features to complete the fabrication of the device 100. For example, where the above processing are directed at a certain device region (such as n-type device region), the method 10 may proceed to form source/drain features in the remaining device regions (such as p-type device region). Moreover, contact features may be formed over the epitaxial source/drain features 500 in the ILD layer 350. Silicide features may be formed between the source/drain features 500 and the contact features. Via features, metal line features, passivation features are additionally formed. It is noted that method 10 above describes example methods of the present disclosure. Processing steps may be added to or eliminated from the methods 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Different embodiments may provide different benefits, and not all benefits are required for any specific embodiment. In an exemplary aspect, the present disclosure is directed to a semiconductor device. The semiconductor device includes a base portion on a semiconductor substrate, a channel layer vertically above the base portion and extending parallel to a top surface of the semiconductor substrate, a gate portion between the channel layer and the base portion, a source/drain feature connected to the channel layer, an inner spacer between the source/drain feature and the gate portion, and an air gap between the source/drain feature and the semiconductor substrate. Moreover, a bottom surface of the source/drain feature is exposed in the air gap.

In some embodiments, the semiconductor device further includes a spacer layer on a sidewall surface of the base portion. The spacer layer and the bottom surface of the source/drain feature define the air gap. In some embodiments, the source/drain feature is spaced away from the base portion by a portion of the spacer layer. In some embodiments, the top surface of the spacer layer extends between the top surface of the base portion and a bottom surface of the channel layer. In some embodiments, the sidewall surface of the source/drain feature facing the inner spacer is entirely covered by dielectric materials without opening spaces. In some embodiments, the inner spacer includes a first spacer material. The first spacer material directly interfaces with the gate portion and directly interfaces with a first portion of the source/drain feature, while spaced away from a second portion of the source/drain feature by a volume. Moreover, the inner spacer further includes a second spacer material directly interfacing with the second portion of the source/drain feature and filling the volume. In some embodiments, the first spacer material has a k value less than about 7, and the second spacer material has a k value greater than about 7. In some embodiments, the air gap has a vertical dimension of about 20 nm to about 50 nm.

In an exemplary aspect, the present disclosure is directed to a semiconductor device. The device includes a semiconductor substrate having a first surface, base structures protruding vertically above the first surface, a plurality of channel layers vertically arranged over the base structures, gate portions between vertically adjacent channel layers, inner spacers on sidewall surfaces of the gate portions, source/drain features on sidewall surfaces of the inner spacers and sidewall surfaces of the channel layers, spacer layers on sidewall surfaces of the base structures and the first surface of the semiconductor substrate, and air gaps defined by the spacer layers and the source/drain features.

In some embodiments, the source/drain features are each spaced away from the base structures. In some embodiments, the spacer layers each have vertical portions on sidewall surfaces of base structures and a horizontal portion on the first surface of the semiconductor substrate. Moreover, the air gaps each extend horizontally between the vertical portions of the respective spacer layer and extending vertically from a bottom surface of a respective source/drain feature to the horizontal portion of the respective spacer layer. In some embodiments, the spacer layers each have a top surface extending along a top surface of a respective base structure. In some embodiments, the inner spacers each include a first sublayer wrapping around a second sublayer on three sides, and where the first sublayer and the second sublayer include different materials. In some embodiments, a bottom surface of the source/drain feature extends below a top surface of the base structure.

In an exemplary aspect, the present disclosure is directed to a method. The method includes receiving a semiconductor substrate that has a stack of first semiconductor layers and second semiconductor layers thereon and a gate structure over the stack. The first semiconductor layers and the second semiconductor layers have different material compositions. The method also includes recessing the stack to form source/drain trenches on both sides of the gate structure and extending into the semiconductor substrate, forming first spacers between end portions of vertically adjacent first semiconductor layers, forming a blocking layer covering exposed surfaces of the semiconductor substrate, and forming source/drain features from sidewall surfaces of the second semiconductor layers and away from the semiconductor substrate.

In some embodiments, the forming of the blocking layer includes forming a spacer layer on sidewall surfaces of the second semiconductor layers and on sidewall surfaces of the first spacers, forming a sacrificial layer on and covering lower portions of the spacer layer, where the sacrificial layer having a top surface extending between a bottom surface of the bottommost first semiconductor layer and a top surface of the bottommost first semiconductor layer, and recessing top portions of the spacer layer not covered by the sacrificial layer. In some embodiments, the forming of the first spacers includes forming openings between end portions of the first spacers, where the forming of the spacer layer includes depositing a dielectric material into openings, and where the recessing of the top portions of the spacer layer forms second spacers within the openings. In some embodiments, the forming of the first spacers includes laterally etching the first semiconductor layers from sidewall surfaces of the first semiconductor layers exposed in the source/drain trenches to form gaps, depositing a spacer material layer in the source/drain trenches and the gaps, and etching back the spacer material to remove portions of the spacer material layer outside the gaps. In some embodiments, the forming of the source/drain features also forms air gaps between the source/drain features and the blocking layer. In some embodiments, the forming of the source/drain features includes implementing a mixture of silane ($SiH_4$) and a dichlorosilane ($SiH_2Cl_2$). The silane is at a first concentration and the dichlorosilane is at a second concentration, where a ratio of the first concentration to the second concentration is about 1:5 to about 5:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a base portion on a semiconductor substrate;
   a channel layer vertically above the base portion and extending parallel to a top surface of the semiconductor substrate;
   a gate portion between the channel layer and the base portion;
   a source/drain feature connected to the channel layer;
   an inner spacer between the source/drain feature and the gate portion, wherein the inner spacer includes a first spacer material in contact with the gate portion and a second spacer material spaced apart from the gate portion by the first spacer material, wherein a dielectric constant of the second spacer material is greater than a dielectric constant of the first spacer material; and
   an air gap between the source/drain feature and the semiconductor substrate,
   wherein a sidewall surface of the source/drain feature facing the inner spacer is entirely interfacing a dielectric material of the inner spacer without opening spaces,
   wherein a bottom surface of the source/drain feature is exposed in the air gap.

2. The semiconductor device of claim 1, further comprising a spacer layer on a sidewall surface of the base portion, wherein the spacer layer and the bottom surface of the source/drain feature define the air gap.

3. The semiconductor device of claim 2, wherein the source/drain feature is spaced away from the base portion by a portion of the spacer layer.

4. The semiconductor device of claim 2, wherein a top surface of the spacer layer extends between the top surface of the base portion and a bottom surface of the channel layer.

5. The semiconductor device of claim 2, wherein the spacer layer is a conformal layer having a sidewall thickness ranging between about 1 nm to about 5 nm.

6. The semiconductor device of claim 1, wherein the inner spacer further comprises:
   a first spacer material that includes silicon dioxide (SiO2), silicon oxynitride (SiON), silicon oxycarbide (SiOC), silicon oxycarbonitride (SiOCN), or combinations thereof and a second spacer material that includes aluminum (Al), titanium (Ti), lithium (Li), hafnium (Hf), zirconium (Zr), lanthanum (La), molybdenum (Mo), cobalt (Co), silicon (Si), oxygen (O), nitrogen (N), carbon (C), or a combination thereof.

7. The semiconductor device of claim 6, wherein the first spacer material has a k value less than about 7, and the second spacer material has a k value greater than about 7.

8. The semiconductor device of claim 1, wherein the air gap has a vertical dimension of about 20 nm to about 50 nm.

9. A device, comprising:
   a semiconductor substrate having a first surface;
   base structures protruding vertically above the first surface;
   a plurality of channel layers vertically arranged over the base structures;
   gate portions between vertically adjacent channel layers;
   inner spacers on sidewall surfaces of the gate portions, wherein each inner spacer has a first sublayer adjacent the gate portions and a second sublayer spaced apart from the gate portions and a dielectric constant of the second sublayer is greater than a dielectric constant of the first sublayer;
   source/drain features on sidewall surfaces of the inner spacers and sidewall surfaces of the channel layers;
   spacer layers on sidewall surfaces of the base structures and the first surface of the semiconductor substrate; and
   air gaps defined by the spacer layers and the source/drain features.

10. The device of claim 9, wherein the source/drain features are each spaced away from the base structures.

11. The device of claim 9, wherein the spacer layers each have vertical portions on sidewall surfaces of base structures and a horizontal portion on the first surface of the semiconductor substrate; and
   wherein the air gaps each extend horizontally between the vertical portions of the respective spacer layer and extending vertically from a bottom surface of a respective source/drain feature to the horizontal portion of the respective spacer layer.

12. The device of claim 9, wherein the spacer layers each have a top surface extending along a top surface of a respective base structure.

13. The device of claim 9, wherein the first sublayer wraps around the second sublayer on three sides, and wherein the first sublayer and the second sublayer include different materials.

14. The device of claim 9, wherein a bottom surface of the source/drain features extends below a top surface of the base structures.

15. A method, comprising:
receiving a semiconductor substrate having a stack of first semiconductor layers and second semiconductor layers thereon and a gate structure over the stack, the first semiconductor layers and the second semiconductor layers having different material compositions;
recessing the stack to form source/drain trenches on both sides of the gate structure and extending into the semiconductor substrate;
forming first spacers between end portions of vertically adjacent first semiconductor layers;
after the forming the first spacers, forming a blocking layer covering exposed surfaces of the semiconductor substrate; and
forming source/drain features from sidewall surfaces of the second semiconductor layers and away from the semiconductor substrate.

16. The method of claim 15, wherein the forming of the blocking layer includes:
forming a spacer layer on sidewall surfaces of the second semiconductor layers and on sidewall surfaces of the first spacers;
forming a sacrificial layer on and covering lower portions of the spacer layer, the sacrificial layer having a top surface extending between a bottom surface of the bottommost first semiconductor layer and a top surface of the bottommost first semiconductor layer; and
recessing top portions of the spacer layer not covered by the sacrificial layer.

17. The method of claim 16, wherein the forming of the first spacers includes forming openings between end portions of the first spacers,
wherein the forming of the spacer layer includes depositing a dielectric material into openings, and
wherein the recessing of the top portions of the spacer layer forms second spacers within the openings.

18. The method of claim 15, wherein the forming of the first spacers includes:
laterally etching the first semiconductor layers from sidewall surfaces of the first semiconductor layers exposed in the source/drain trenches to form gaps;
depositing a spacer material layer in the source/drain trenches and the gaps; and
etching back the spacer material layer to remove portions of the spacer material layer outside the gaps.

19. The method of claim 15, wherein the forming of the source/drain features also forms air gaps between the source/drain features and the blocking layer.

20. The method of claim 15, wherein the forming of the source/drain features includes implementing a mixture of silane ($SiH_4$) and a dichlorosilane ($SiH_2Cl_2$), wherein the silane is at a first concentration and the dichlorosilane is at a second concentration, and wherein a ratio of the first concentration to the second concentration is about 1:5 to about 5:1.

* * * * *